United States Patent [19]
Yoshitomi et al.

[11] Patent Number: 5,955,761
[45] Date of Patent: Sep. 21, 1999

[54] SEMICONDUCTOR DEVICE AND MANUFACTURING METHOD THEREOF

[75] Inventors: Takashi Yoshitomi, Kamakura; Hiroshi Iwai, Kawasaki; Masanobu Saito, Chiba; Hisayo Momose, Tokyo-to; Tatsuya Ohguro; Mizuki Ono, both of Yokohama, all of Japan

[73] Assignee: Kabushiki Kaisha Toshiba, Kawasaki, Japan

[21] Appl. No.: 09/069,980

[22] Filed: Apr. 30, 1998

Related U.S. Application Data

[62] Division of application No. 08/497,554, Jun. 30, 1995, Pat. No. 5,780,901.

[30] Foreign Application Priority Data

Jun. 30, 1994 [JP] Japan ................................. 6-148398
May 18, 1995 [JP] Japan ................................. 7-120229

[51] Int. Cl.$^6$ ................................................. H01L 27/088
[52] U.S. Cl. .................... 257/336; 257/344; 257/408; 257/412; 257/413; 257/900
[58] Field of Search ................................. 257/336, 344, 257/408, 900, 412, 413

[56] References Cited

U.S. PATENT DOCUMENTS

| | | | |
|---|---|---|---|
| 4,636,834 | 1/1987 | Shepard | 357/23.3 |
| 5,235,204 | 8/1993 | Tsai | 257/408 |
| 5,386,133 | 1/1995 | Hiroki et al. | 257/344 |
| 5,439,839 | 8/1995 | Jang | 257/344 X |
| 5,448,094 | 9/1995 | Hsu | 257/330 |
| 5,453,635 | 9/1995 | Hsu et al. | 257/408 X |
| 5,472,897 | 12/1995 | Hsu et al. | 437/44 |
| 5,559,357 | 9/1996 | Krivokapic | 257/336 |
| 5,567,966 | 10/1996 | Hwang | 257/347 |
| 5,780,896 | 7/1998 | Ono | 257/344 |
| 5,780,901 | 7/1998 | Yoshitomi et al. | 257/336 |

FOREIGN PATENT DOCUMENTS 5343417 12/1993 Japan.

*Primary Examiner*—William Mintel
*Attorney, Agent, or Firm*—Foley & Lardner

[57] ABSTRACT

A semiconductor device capable of restraining a short channel effect and obtaining a current drivability that is as high as possible includes a semiconductor substrate, a gate insulating film formed on the surface of this substrate, a gate electrode formed on this gate insulating film and side wall insulating films formed on this gate electrode and along side walls of the gate insulating film. The semiconductor device further includes side wall conductor films formed adjacent to the side wall insulating films and a source/drain region formed in a surface region of the substrate under the side wall conductivity film and in a surface region, adjacent to the side wall conductivity film, of the semiconductor substrate. An impurity concentration in a depthwise direction of the substrate with the surface of the side wall conductor film serving as a starting point exhibits one maximum value in a predetermined depth but decreases in a portion deeper than the predetermined depth.

18 Claims, 19 Drawing Sheets

SECTION A − A′

SECTION A–A'

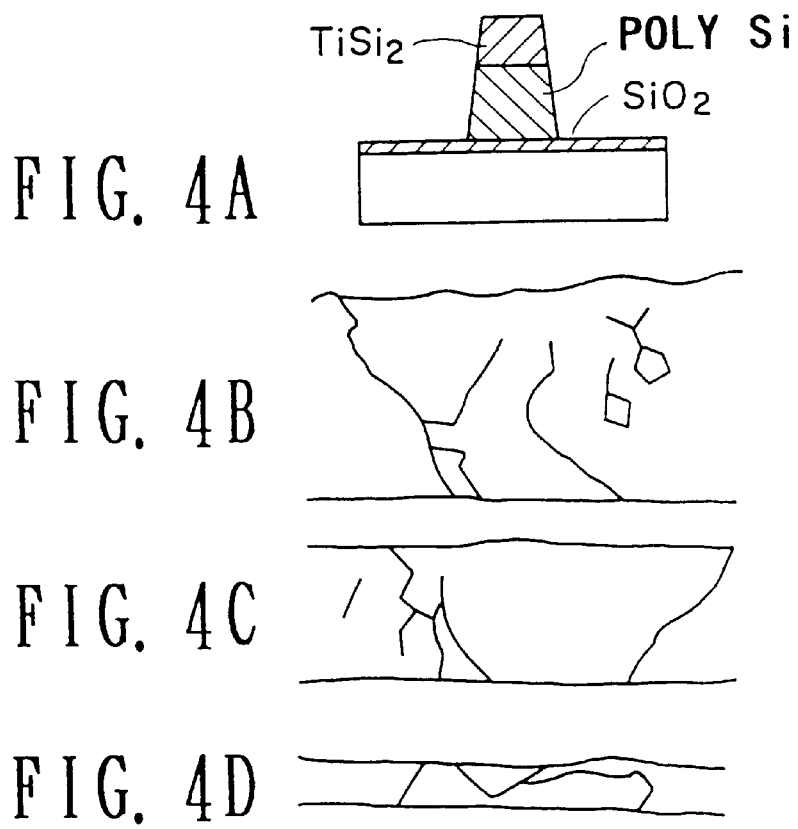
FIG. 4A
FIG. 4B
FIG. 4C
FIG. 4D
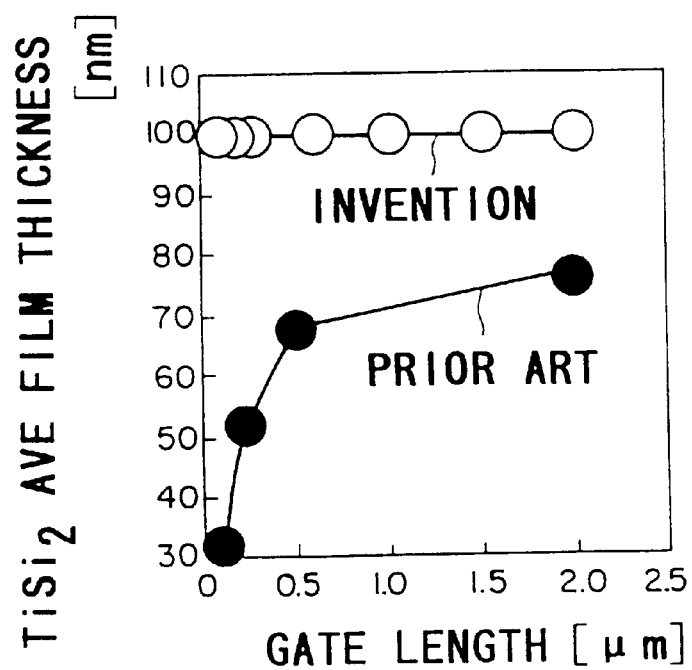
FIG. 5

SEMICONDUCTOR DEVICE AND MANUFACTURING METHOD THEREOF

This application is a divisional of application Ser. No. 08/497,554, filed Jun. 30, 1995, now U.S. Pat. No. 5,780,901.

BACKGROUND OF THE INVENTION

1. Field of the Invention

The present invention relates generally to a semiconductor device and a manufacturing method thereof and, more particularly, to a high-speed operable semiconductor device and a manufacturing method thereof.

2. Description of the Background Art

In recent years, with an advancement of high integration of a semiconductor integrated circuit, the elements are formed into a remarkably miniaturized structure. A problem inherent in a MISFET (Metal Insulator Silicon Field Effect Transistor) among these elements is a punch-through phenomenon between a source and a drain due to a short channel effect. For obviating this problem, an LDD (Lightly Doped Drain) structure has been conventionally proposed.

Hereinafter, an LDD-structured MOSFET (Metal Oxide Silicon Field Effect Transistor) conceived as a prior art relative to the present invention will be explained with reference to FIG. 20.

This MOSFET is formed in the manner which follows.

To start with, an element isolation region 2 composed of a field oxide film, a gate oxide film 5 and a gate polycrystalline silicon (referred to as polysilicon hereinafter) film 6 are formed on a silicon substrate 1. Further, a $SiO_2$ film 7 is formed on the gate polysilicon film 6. Next, $BF_2$ ions are implanted into the substrate 1 under such conditions that an acceleration voltage is 20 KeV, and a dose is on the order of $1 \times 10^{14} cm^{-2}$, thus forming an LDD structured low concentration ion implanted region 4b. Thereafter, a $SiO_2$ film is deposited 100 nm on the entire surface of the substrate, and subsequently $SiO_2$ side walls 10 are formed 100 nm in width on side surfaces of the gate polysilicon film 6 on both sides by etching the $SiO_2$ film 100 nm deep using an RIE (Reactive Ion Etching) method. Further, the $BF_2$ ions are implanted at an acceleration voltage of 30 KeV with a dose on the order of $1 \times 10^{15} cm^{-2}$, thus forming a high-concentration ion implanted region 4a. Thereafter, the impurity introduced by an ion implanting method is activated at 1000° C. for 10 sec by use of an RTA (Rapid Thermal Anneal) method, thereby forming a source/drain diffused layer. Thereafter, a refractory metal film, e.g., a Ti film is deposited on the entire surface of the substrate by a sputtering method, and subsequently titanium silicide is obtained with a reaction on Si of the substrate by the RTA method. Hereafter, Ti remaining unreactive is removed by a sulfate hydrogen peroxide water series treatment. With the above processes, a metal silicide film 4c is selectively formed on only the high-concentration ion implanted region 4a where the substrate surface is exposed. Finally, an inter-layer insulating film 8 is deposited on the surface of the substrate 1, and an opening for contact is formed. Thereafter, a source/drain electrode 9 is wired, thus completing the MOSFET.

This LDD-structured MOSFET is intended to relieve a drain electric field by forming the low-concentration ion implanted region 4b in a source-to-drain channel region, increase a withstand voltage and also prevent the short channel effect. Further, the low-resistance metal silicide film 4c is formed on the surface of the source/drain diffused layer 4a in order to decrease the resistance.

Herein, the action of restraining the above short channel effect depends largely on a junction depth of the low-concentration region 4b, and the short channel effect tends to be restrainable when the junction is shallow. As described above, however, when forming the source and the drain with the ion implantation and the diffusion, it is difficult to attain both making the junction shallower and making the impurity concentration higher. Therefore a parasitic resistance of the low-concentration region 4b increases, and the current drivability (driving ability) is reduced. That is, according to the LDD structure, when trying to restrain the short channel effect, deterioration of the current driving ability is inevitable. Reversely when trying to obtain larger current driving ability, there arises a problem of increasing the short channel effect.

In this connection, as illustrated in FIG. 21, there has recently been proposed an SPDD (Solid Phase Diffused Drain) structure for forming a film serving as a source of a solid diffusion such as a BSG film on the gate electrode side wall 10 and forming a high concentration but shallow source/drain diffused layer with the solid-phase diffusion therefrom. This SPDD-structured MOSFET is capable of actualizing a shallower but lower resistance source/drain region than by the conventional LDD structure. However, the problem thereof is that the reduction in the resistance is not sufficient for those having a gate length of 0.2$\mu$m or under.

Further, for the purpose of improving a hot carrier resistance, there has been made a proposal of providing the conductor side walls so as to directly contact an upper portion of the low-concentration region in the LDD-structured MOSFET. Even in the MOSFET having this structure, the LDD-structured low-concentration region exhibits a high resistance, and the above conductor side wall does not affect the short channel effect and the current drivability. Hence, there still exists such a problem that the deterioration of the current driving ability is inevitable when trying to restrain the short channel effect.

Further, as illustrated in FIG. 22A, for reducing the resistance of the gate polysilicon film 6, there has been an attempt to form, when forming metal silicide films on the source and the drain, the same metal silicide film 4c also on the gate surface. In this case, however, a resistivity of the metal silicide film increases with a reduction in the width of the gate polysilicon film 6, FIG. 22B shows an example of a polysilicon width dependency of a $TiSi_2$ sheet resistance (=(resistivity)/(film thickness)). It can be known that if the width of the polysilicon film 6 is 2.0 $\mu$m or smaller, the sheet resistance begins increasing sluggishly but, if under 0.5 $\mu$m, rises abruptly.

This phenomenon is called a fine wiring effect that is a big problem in terms of forming the metal sillcide film on the silicon layer which is led out from a gate electrode or a source/drain electrode.

For avoiding this fine wiring effect, it is found that not the metal silicide film but the metal film is employed in a portion having a small reactive areal size such as a gate portion. The metal film is smaller in resistance than the polysilicon film, and it is desired that the metal film be:used for the semiconductor device in terms of the current drivability. The metal is, however, etched by an acid consequently, there exists a problem in which a treatment using a solution containing an acid, such as a sulfate hydrogen peroxide water series, for peeling off the resist after forming the metal film can not be performed. For this reason, it is difficult to use the metal film in place of the metal silicide film. It is a primary object of the present invention, which was devised in view of such circumstances, to provide e semiconductor device and a manufacturing method thereof that are capable of restraining a short channel effect and obtaining as high current drivability as possible.

SUMMARY OF THE INVENTION

According to the first aspect of the present invention, there is provided a semiconductor device comprising:

a semiconductor substrate;

a gate insulating film formed on the surface of said substrate;

a gate electrode formed on said gate insulating film;

a side wall insulating film formed along a side wall of said gate insulating film as well as on said gate electrode;

a side wall conductor film formed adjacent to said side wall insulating film; and a source/drain region formed in said side wall conductor film on both sides of said gate electrode, a surface region of said substrate under said side wall conductor film and in a surface region, adjacent to said side wall conductor film, of said substrate, wherein an impurity concentration in a depthwise direction of said substrate exhibits one maximum value in a predetermined depth with the surface of said side wall conductor film serving as a starting point but decreases in a portion deeper than the predetermined depth.

According to a first mode of a semiconductor device in a first aspect of the present invention, an impurity concentration of a source/drain region in a depthwise direction of a substrate with the surface of a side wall conductor film serving as a starting point has such a distribution that the impurity concentration becomes its maximum in a predetermined depth but decreases in a portion deeper than a point where this maximum concentration is attained. Accordingly, regions where the concentration of impurity formed by an ion implantation from the substrate surface as in a LDD structure extremely decreases but a resistance increases do not exist in a side wall conductor film and in an impurity diffused layer in the vicinity of a gate electrode under this conductor film. Therefore, a current path of a drain current expands in width from a low-resistance but high-concentration impurity region (source/drain region) to a side wall conductor film, and a current drivability is enhanced. Further, the diffused layer is not formed deep in the substrate in the vicinity of the gate electrode, and a short channel effect can be restrained.

According to a second mode, a junction depth exerting a large influence on the short channel effect is set to 100 nm or under, and a concentration of an interface region between the substrate and the side wall conductor film which influences the short channel effect is set on the order of $3 \times 10^{19} cm^{-3}$ or higher that was not hitherto obtained, thereby attaining a high current drivability while restraining the short channel effect. Further, as in the same way with the semiconductor device according to the first mode, the current path is expanded in width, and, with this expansion, the current drivability can be enhanced.

According to a third mode, it is possible to attain a high drivability and a high velocity that cannotbe obtained by the conventional LDD- and SPDD-structured semiconductor devices because of providing a wide current path and exhibiting a low specific resistance.

According to a fourth mode, a low-resistance source/drain region is formed extending to an edge portion of a gate insulating film.

According to fifth mode, a leak current which will possibly be caused can be restrained even in a source/drain region separate from a gate electrode.

According to a sixth mode, a monocrystalline semiconductor film is used as a conductor film, and, with this usage, a crystalline property is excellent, and the resistance is made smaller. If this monocrystalline film is formed of an amorphous silicon film, a junction depth of a diffused layer can be controlled, and, hence, a desired drivability and a resistance against the short channel effect can be obtained.

According to a seventh mode, a polycrystalline semiconductor film having a versatility is employed, and a facility of the process is obtained.

According to an eighth mode, a metal film is used as a conductor film, and the resistance can be further reduced.

According to a ninth mode, a metal silicide film is formed on the surface of the source/drain region, and, with this formation, a source/drain resistance can be decreased.

According to tenth and eleventh modes, a fine wiring effect can be avoided. Further, an increase in a gate resistance can be restrained, whereby the current drivability can be enhanced.

According to twelfth and thirteenth modes, a gate length of the gate electrode is 0.6 $\mu$m or under, and, as a result of a test, the increase in the gate resistance can be restrained without being influenced by the fine wiring effect.

According to the second aspect of the present invention, there is provided a method for manufacturing a semiconductor device comprising the steps of:

forming a gate insulating film on the surface of a semiconductor substrate;

forming a gate electrode formed on said gate insulating film;

forming a side wall insulating film along a side wall of said gate insulating film as well as on said gate electrode by effecting anisotropic etching after forming an insulating film on the entire surface of said semiconductor substrate;

forming a side wall conductor film adjacent to said side wall insulating film by performing the anisotropic etching after forming a conductor film on the entire surface of said semiconductor substrate;

forming a source/drain region in said conductor films on both sides of said gate electrode and in a surface region, adjacent to said side wall conductor film, of said substrate by implanting ions; and forming part of said source/drain region by activating an impurity within said source/drain region while effecting a thermal treatment and by, at the same time, performing a diffusion.

According to a first mode of a method of manufacturing a semiconductor device in a second aspect of the present invention, the source/drain region under the side wall conductor film is formed with a solid-phase diffusion from the side wall conductor film but is not formed deep in the substrate, thereby making it possible to restrain the short channel effect. Then, since the side wall conductor film becomes part of the source/drain region, the electric current flowing between the source and the drain increases in its sectional area, resulting in a reduction in the resistance of the source/drain region. This in turn makes it possible to enhance the current drivability.

According to a second mode, the low-resistance source/drain region is formed extending to the edge portion of the gate insulating film, whereby an especially high drivability can be acquired.

According to a third mode, a thickness of the side wall insulating film is substantially equal to a length of the diffusion in the lateral direction, and therefore the low-resistance source/drain region is formed extending to the edge portion of the gate insulating film, whereby a high current drivability can be obtained.

According to a fourth mode, the metal silicide film is formed on the surface of the source/drain region, with the result that a source/drain resistance can be reduced while the current drivability can be enhanced.

According to a fifth mode, the conductor film is formed on the entire surface of the substrate in an amorphous or polycrystalline state. In the case of the amorphous state, since the depth of the diffused layer can be controlled, both a desired drivability and a resistance against the short channel effect are obtained. Further, in the case of the polycrystalline state, there is a superior point of a facility of process.

According to a sixth mode, the impurity is added to the conductor film before performing anisotropic etching. Therefore, when implanting the ions for forming the source/drain region, a concentration of the impurity in the conductor film becomes high enough to exceed an impurity concentration in the source/drain region under the conductor film that is formed with the diffusion. The high current drivability can be thereby obtained.

According to seventh and eighth modes, it is feasible to prevent a metal gate from being dissolved into a peroxide water series solution for removing a resist with a carbon film serving as a mask. A gate metal is thereby usable, and an increase in gate resistance can be restrained. This in turn makes it possible to enhance the current drivability. Further, because of implanting the ions through the carbon film, a diffused layer with a shallow junction can be formed without decreasing an implantation energy, and the short channel effect can be regulated.

BRIEF DESCRIPTION OF THE DRAWINGS

Other objects and advantages of the present invention will become apparent during the following discussion in conjunction with the accompanying drawings, in which:

FIG. 4A–4D are characteristic diagrams of assistance in explaining an effect of the embodiment shown in FIGS. 2A–2D;

FIG. 5 is a characteristic diagram of assistance in explaining the effect of the embodiment shown in FIG. 2A–2D;

DESCRIPTION OF THE PREFERRED EMBODIMENTS

Figure 1A:
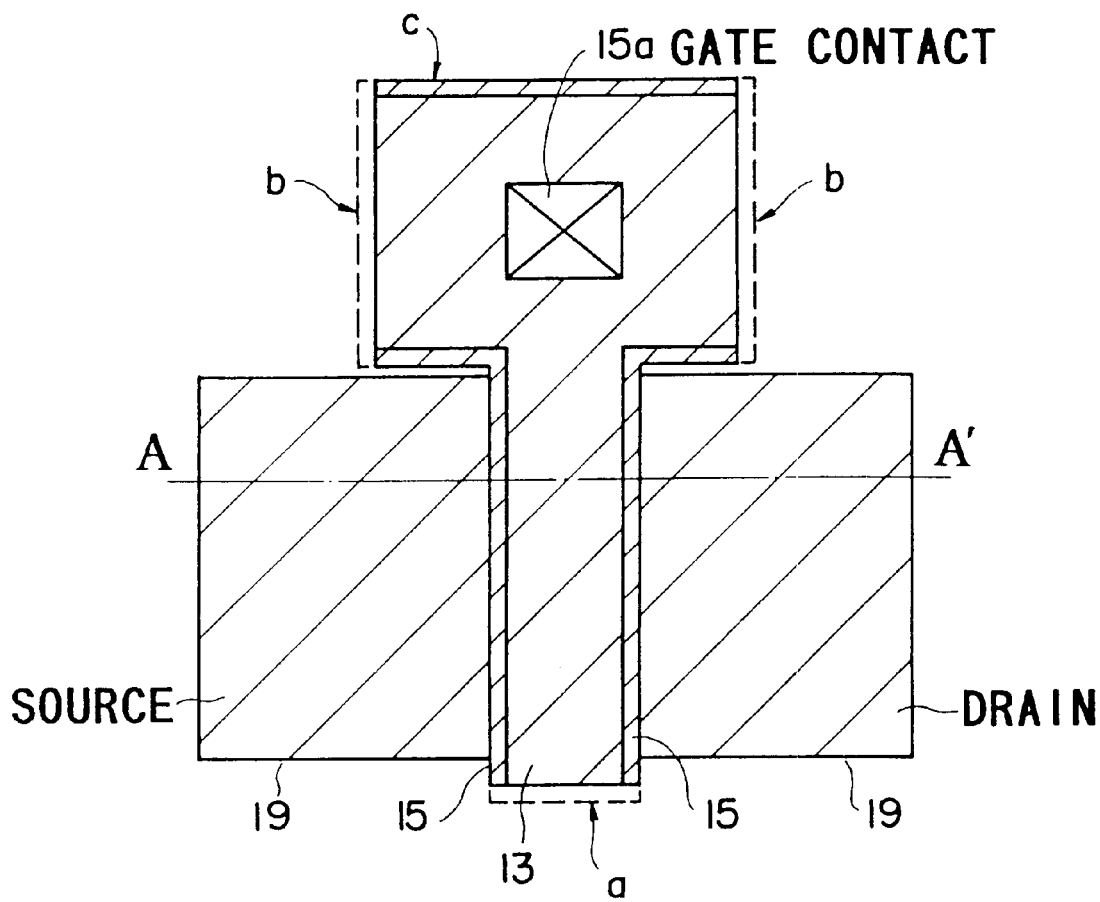
FIGS. 1A and 1B are diagrams each showing a construction of a first embodiment of a semiconductor device according to a first invention.
Figure 1B:
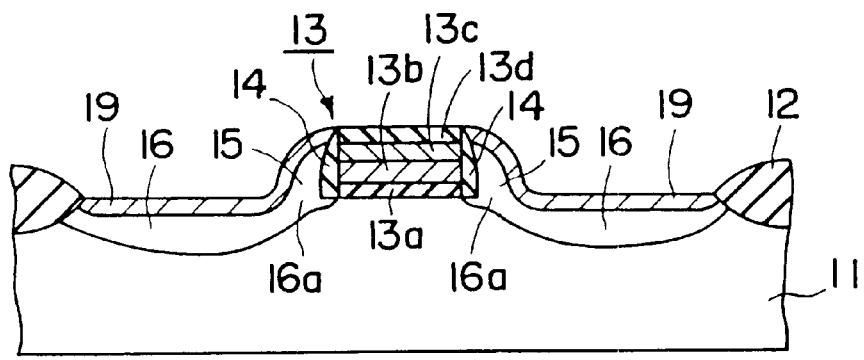

FIGS. 1A and 1B illustrate a configuration of a first embodiment of a semiconductor device according to a first invention. The semiconductor device in this embodiment is classified as a MOSFET. FIG. 1A is a plan view thereof. FIG. 1B is a sectional view of the semiconductor device cut substantially along the cutting plane line A–A' of FIG. 1A. The semiconductor device in this embodiment is constructed such that a gate insulting film $13a$ is formed on the surface of a semiconductor substrate 11 formed with a field oxide film 12 for isolating elements, and a polysilicon film $13b$, a gate electrode 13 composed of a titanium silicide film $13c$ and a nitride film $13d$ is formed on this gate insulating film $13a$. Then, side wall insulating films 14 are formed along the side portions of the gate insulating film $13a$ and of the gate electrode 13, and side wall conductor films (e.g., silicon films) 15 are formed adjacent to the side wall insulating films 14. Further, source/drain regions 16 are formed on the surface of the semiconductor substrate 11 on both sides of the conductor film 15 as well as along the side wall conductor films 15 so that the gate electrode 13 is sandwiched in therebetween. Metal silicide films 19 are formed on the surfaces of the source/drain regions.

Then, a concentration of impurity in a depthwise direction of the substrate 11 with the surface of the side wall conductor film 15 serving as a starting point exhibits one maximum value in a predetermined depth, and the impurity is so implanted as to reduce its concentration in a portion deeper than this predetermined depth. Note that source/drain regions 16a in the vicinity of the gate electrode 13 within the semiconductor substrate 11 are formed by diffusions from the conductor films 15, and the side wall insulating films 14 are formed narrowly so that a thickness thereof is substantially equal to a length of the lateral diffusion. According to this semiconductor device, when a channel is formed upon switching ON the MOSFET, an electric current flows between the source/drain regions 16 via the side wall conductor films 15.

Note that regions surrounded by dotted lines in FIG. 1A are the regions where the same layers as the side wall conductor films 15 provided along the side walls of the gate electrode were formed.

After forming the side wall conductor films, it follows that a conductive path is made between the source and drain regions because of the side wall conductor films being formed circumambient to the gate portion 13. Preventing this conduction entails removing at least part of the side wall conductor films within the regions a, b by etching such as with a RIE method, etc. Further, cutting off the conduction on the side of a gate contact, at least part of a segmental region c bearing in a face-to-face relationship with the region a may be removed.

Figure 20:
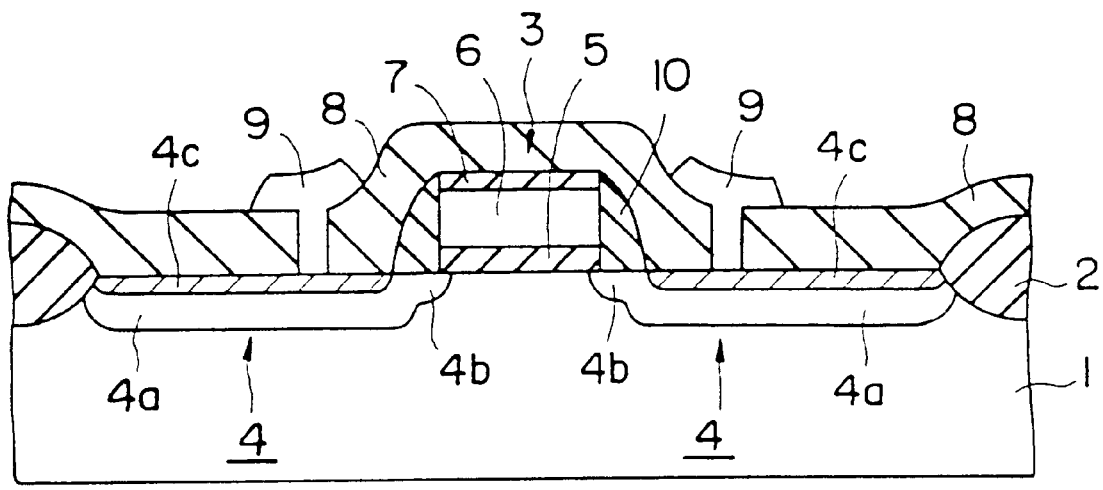
FIG. 20 is a sectional view showing a MOSFET based on a conventional LDD structure.

The semiconductor device in this embodiment can be structured so that the source/drain regions 16a in the vicinity of the gate electrode 13 within the semiconductor substrate 11 are formed by the diffusions of impurity from the side wall conductor films 15, and hence the concentration of the impurity exhibits the maximum value in the predetermined depth from the surface of the side wall conductor film 15 but the portion deeper than the predetermined depth has no other maximum value. This means that the impurity concentration decreases or exibits a constant value in a portion deeper than the predetermined depth. Accordingly, unlike an ion implantation method from the substrate surface which is employed for the conventional LDD-structured MOSFET, it is possible to obtain a high-concentration but shallow junction layer in close proximity to the gate. Further, the side wall insulting films 14 are formed narrowly so that the thickness thereof is subtan-tially equal to the length of the lateral diffusion, and, therefore, an effective channel length can be substantially equalized to a width of the gate electrode. This makes it possible to restrain a short channel effect. The diffused layer region 16a in the vicinity of the gate electrode 13 has a higher concentration than the conventional LDD-structured low concentration diffused layer region (4b in FIG. 20), and the side wall conductor film 15 can be also widened in terms of a sectional areal size of a current path because of being the source and the drain. A resistance can be thereby reduced, and an electric current drivability becomes greater than in the prior art.

Further, by appropriately controlling the height of the side wall conductor 15 and energy of ion implantation, it is possible to prevent a leak current from being produced between the substrate 11 and the silicide film 19 which may occur when the silicide film 19 replaces the diffused layer 16 and protrudes into the diffused layer during formation of the silicide film 19. This results in no loss of the current drivability.

Note that the gate electrode 13 takes a stacked structure composed of the polysilicon film 13b, the titanium silicide film 13c and the nitride film 13d in the embodiment discussed above. The same effect can be, however obtained by a gate electrode based on a single-layered structure.

Next, a first embodiment of a method of manufacturing a semiconductor device according to a second invention will be discussed with reference to FIGS. 2A–2D. According to the manufacturing method in this embodiment, the semiconductor device illustrated in FIG. 1 is to be manufactured.

Figure 2A:
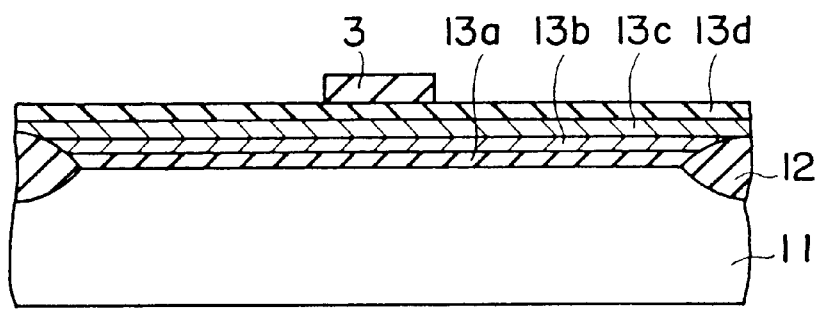
FIGS. 2A–2D are sectional views each illustrating a manufacturing process of a first embodiment of a method of manufacturing a semiconductor device according to a second invention.

To start with, as illustrated in FIG. 2A, the field oxide film 12 is formed on the surface of the n-type silicon substrate 11 by a LOCOS (Local Oxidation of Silicon) method, etc., and the oxide film 13a serving as a gate insulating film, the polysilicon film 13b, the titanium silicide film 13c and the nitride film 13d are formed in sequence on the surface of the substrate 11. Thereafter, a resist pattern 3 is formed on a region where a gate electrode is to be formed. Herein, the oxide film 13a is formed by a thermal oxidation, while the polysilicon layer 13b is deposited up to a thickness of 350 nm by a CVD (Chemical Vapor Deposition) method. The titanium silicide film 13c is formed in such a way that an unillustrated titanium film is deposited 100 nm on the surface of the polysilicon film 13b by a sputtering method, and the polysilicon film 13 and the titanium film react on each other by an RTA (Rapid Thermal Anneal) method. The nitride film 13d is formed by the CVD method or the like after removing the titanium film showing no reaction but residual in a silicifying process thereof. Further, the resist pattern 3 is formed on a predetermined gate area by a photolithography process.

Figure 2B:
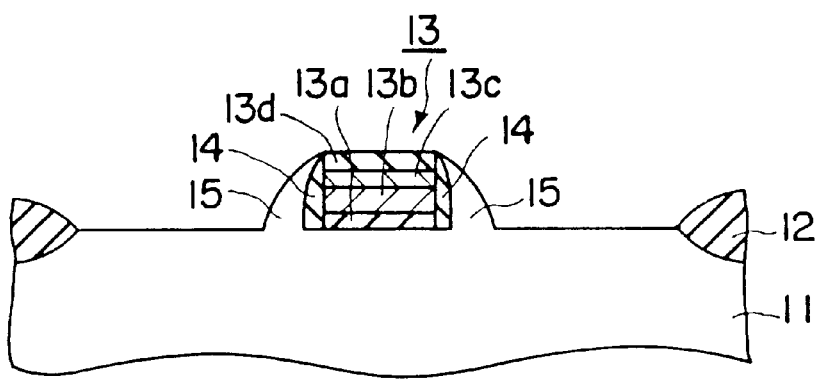

Next, as illustrated in FIG. 2B, with the resist pattern 3 serving as a mask, the nitride film 13d, the titanium silicide film 13c, the polysilicon film 13b and the gate insulating film 13a sequentially undergo patterning, thus forming the gate portion 13. Then, after removing the resist pattern 3, the gate side wall films 14 composed of silicon nitride are formed along the side walls of the gate portion 13, and the monocrystalline silicon films 15 serving as side wall conductor layers are formed adjacent to the gate side wall films 14. The gate side wall films 14 are formed along the gate side walls by anisotropic etching such as a RIE (Reactive Ion Etching) by depositing a nitride layer having a thickness of 20 nm on the surface of the substrate 11 by the CVD method or the like. Further, forming the monocrystalline silicon film 15 involves steps of removing a natural oxide film on the substrate surface by a dilute hydrofluoric acid treatment, thereafter having an amorphous silicon layer deposited 200 nm by an LPCVD (Low Pressure CVD) method, performing the anisotropic etching such as the RIE method thereafter, subsequently effecting a thermal treatment at 600° C. for 2 hours in an inactive gas atmosphere of, e.g., a nitride gas or the like and thereby monocrystallizing it from a contact area with the substrate.

A thickness of the side wall conductor film 15 is properly set optimal corresponding to a desired MOSFET characteristic. The short channel effect can be also restrained by increasing the thickness thereof.

Figure 2C:
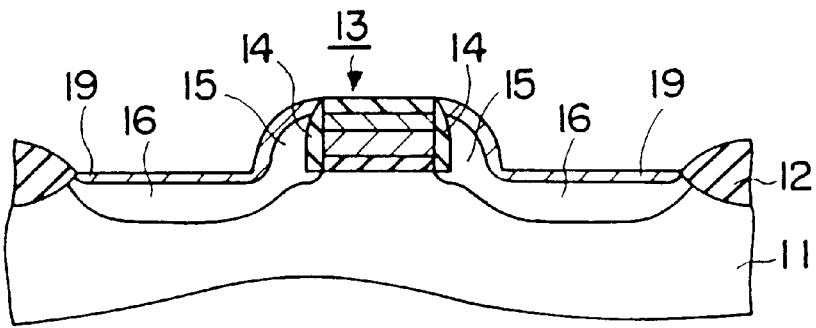

Next, after implanting $BF_2$ ions into the surface of the semiconductor substrate 11 as well as into the monocrystalline silicon film 15, the implanted ions are activated by effecting the thermal treatment by an RTA method at 1000° C. for 10 sec., thereby forming the source/drain diffused layers 16. Herein, an implantation energy and a dose when implanting the ions are regulated to predetermined values for preventing a generation of the leak current in consideration of a thickness of the silicide film so as not to cause a flow of the leak current between the silicide film 19 formed afterward and the substrate because of protrusion of the silicide film 19 into the diffused layer 16. For example, the implantation energy is 30 KeV, the dose is $4\times10^{15}\text{cm}^{-2}$, and the depth of the diffused layer is 100 nm. Subsequently, the titanium film is deposited 20 nm on the entire surface by the sputtering method. On this occasion, though a hydrofluoric acid series treatment is carried out as a pretreatment, the titanium silicide film on the gate electrode is protected by the nitride silicon film 13d and the side wall 14 and therefore undergoes no etching. Next, the titanium film and the substrate silicon react on each other by the RTA method, thereby forming the titanium silicide film 19 having a thickness on the order of 50 nm (FIG. 2C). Thus, the source and drain are formed so as not to be proximal to the titanium silicide film of the gate electrode, and the generation of the leak current can be thereby prevented.

Figure 2D:
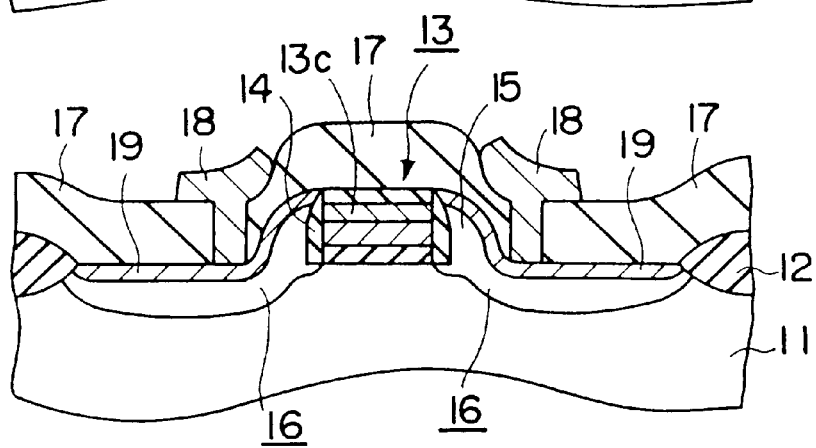

Subsequently, as illustrated in FIG. 2D, an inter-layer insulating film 17 is deposited on the surface, and contact openings for the source and the drain are formed. Thereafter, interconnections 18 for the source and drain electrodes are formed, thus completing the MOSFET in this embodiment. Note that the side wall insulating films 14 are formed so that the thickness thereof is substantially equal to the length of the lateral diffusion.

According to the manufacturing method in this embodiment, there can be provided such a structure that the diffused layers 16a in the vicinity of the gate electrode 13 are formed by the impurity diffusions from the side wall conductor films 15, and therefore the concentration of impurity exhibits the maximum value in the predetermined depth from the surface of the side wall conductor film 15, but the portion deeper than the predetermined depth has no other maximum value. Accordingly, unlike the ion implantation method employed for the conventional LDD-structured MOSFET, the low-concentration regions do not exist on the substrate surface in the vicinity of the gate. That is the shallow junction layer 16a can be obtained with the high concentration, and the side wall insulating films 14 are formed narrowly so that the thickness thereof is substantially equal to the length of the lateral diffusion. Hence, the effective channel length can be substantially equalized to the width of the gate electrode, and it is possible to restrain the short channel effect and attain the high drivability. Further, the diffused layer region 16a in the vicinity of the gate electrode 13 has the higher concentration than the conventional LDD-structured low concentration diffused layer region (4b in FIG. 20), and the side wall conductor film 15 can be also widened in terms of the sectional areal size of the current path because of being the source and the drain. The resistance can be thereby reduced, and the electric current drivability can be improved.

Further, the height of the side wall conductor film 15 and the ion implantation energy are properly adjusted, and it is thereby possible to prevent the leak current from being produced between the substrate 11 and the silicide film 19 due to the fact that the silicide film 19 protrudes into the diffused layer when forming the silicide film 19.

Note that the gate electrode 13 takes the laminated structure composed of the polysilicon film 13b, the titanium silicide film 13c and the nitride film 13d in the embodiment discussed above. It is, however, feasible to attain the effect obtained from the above drain structure when constructing a gate electrode with a single-layered structure.

Note that the formation of the monocrystalline side wall 15 shown in FIG. 2B involves the use of the amorphous silicon film in the embodiment discussed above, but a restraining effect of the above-mentioned short channel effect is to be obtained even by use of the polysilicon in place of this amorphous silicon.

Moreover, the source/drain diffused layers can be also formed by implanting the impurity when depositing the amorphous silicon film for forming the side walls 15 and causing the diffusion by effecting the thermal treatment. In this case, when activating the ions in the source/drain diffused layers, the diffusions from the side wall silicon films 15 increase by performing the thermal treatment by employing the RTA method, and the restraining effect for the short channel effect is, it can be considered, reduced if the diffusions thereby spread deeply in the substrate. Instead, however, the spread of the diffusion can be prevented by performing the following processes. That is, after a non-doped silicon film 15 has been deposited on the whole surface, the ions are implanted with a dose on the order of $10^{16}\text{cm}^{-2}$ and an acceleration energy of 30 KeV. Subsequently, the heating treatment is carried out under such conditions that a thermal treatment temperature is set at a comparatively low temperature of 900° C. or below, and a thermal treatment time is set to a comparatively long time of 20 sec or longer. Thus, under such low-temperature but long-time conditions, a distribution of the impurity concentration in the silicon film 15 can be uniformized without any diffusion of the impurity into the substrate. Thereafter, the side wall silicon films 15 are formed by the RIE method or the like, and subsequently the ions are implanted into the outside portions thereof, thus forming the source and the drain including shallow regions under the side walls by the thermal processes at a high temperature by the RTA or the like for a short period of time. In this way, the impurity is implanted when depositing the amorphous silicon film for forming the side walls 15, and the diffusion is caused by the thermal treatment. In this case, it is possible that the diffused layers in the vicinity of the gate electrode can have a shallow junction, and, hence, no leakage is produced with respect to the substrate even by implanting the impurity with a high concentration. Further, a junction depth is controlled by forming the diffused layers on the exposed substrate surface only by the ion implantation, thus making it possible to sufficiently regulate the leakage with respect to the substrate.

According to the processes in the above-discussed embodiment, the ions are implanted after crystallizing the amorphous silicon films 15, but the films 15 can be crystallized after the ion implantation. With this treatment, an impurity profile in the side wall silicon films 15 after implanting the ions is formed shallower than in the case where the ions are implanted after the crystallization. Then, a junction of the region formed by a solid-phase diffusion from the side wall silicon film is also shallow, and, hence, this is effective in terms of the restraint of the short channel effect. This lies in the fact that lattices of the amorphous silicon film are nor regularly arrayed, and therefore the implanted ions do not spread deep into the film.

Further, according to the method of manufacturing the MOSFET in this embodiment described above, the titanium silicide film 13c of the gate portion 13 is, unlike the prior art, at first, subjected to the patterning in a gate-like configuration after being formed on the entire surface of the substrate 11, and therefore an occurrence of the finer wire effects can be prevented as well as keeping uniform a quality of the titanium silicide film 13c. Hence, the resistance can be reduced, and the current drivability can also be enhanced. Further, it is possible to form the silicide film thick on the gate without receiving the restriction due to the increases in the leak current as seen in a case where the silicide film is formed thick on the shallow source/drain diffused layer.

The reason why the production of the finer wiring effect as in the prior art is restrained in accordance with the embodiment discussed above will be elucidated from a variety of tests made by the prevent inventors, and a detailed explanation will be given as below.

Figure 3A:
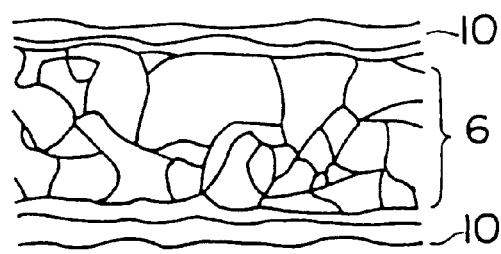
FIGS. 3A–3D are explanatory diagrams of assistance in explaining problems inherent in the prior art.
Figure 3B:
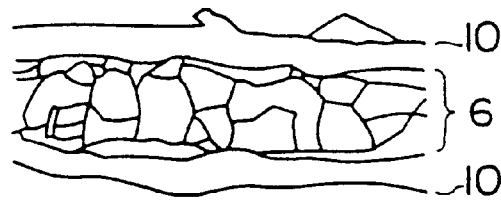
Figure 3C:
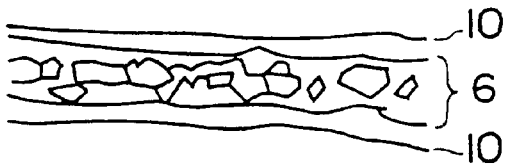
Figure 3D:
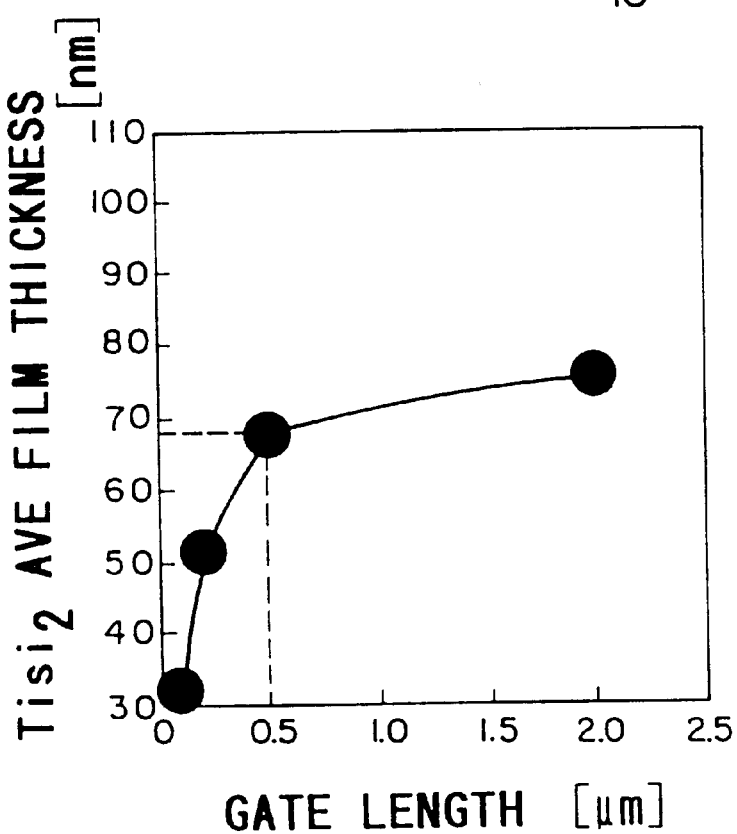
Figure 22A:
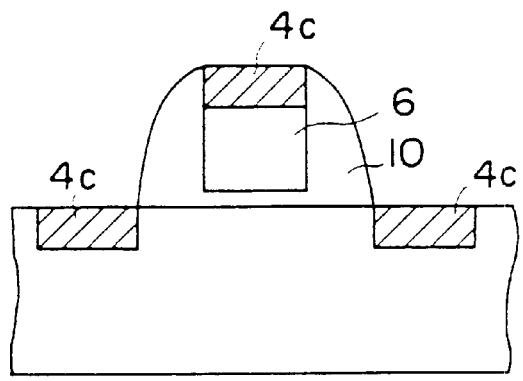
FIGS. 22A and 22B are explanatory diagrams of assistance in explaining problems inherent in the conventional MOSFETs.
Figure 22B:
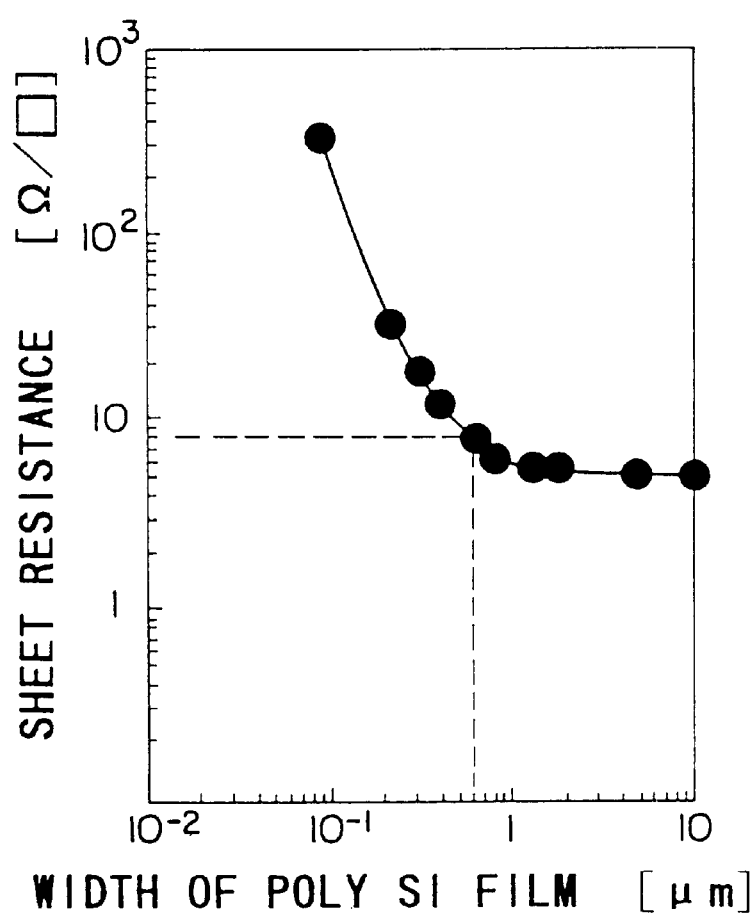

At first, FIGS. 3A, 3B, 3C are sketch diagrams each illustrating the surface of the $TiSi_2$ film of the gate electrode when observing a surface by use of the transmission electron microscope, wherein the gate length of the conventional MOSFET shown in FIG. 22A is changed such as 0.4 μm, 0.2 μm, 0.1 μm. As known from FIGS. 3A–3C, with a reduction in width of the polysilicon film, smaller particles among the crystalline particles of $TiSi_2$ increase. It is also known that the thickness of the $TiSi_2$ film formed on the polysilicon 6 is smaller in the peripheral portion to polysilicon than in the central portion. The following is also known from a test for diffraction of electron beams. The crystalline particles having a small particle size assumes a high resistance phase represented by C49, and the crystalline particles having a large particle size assume a low resistance phase shown by C54. When the width of the polysilicon film is large, the resistance of the $TiSi_2$ film changes down to a low value with a change from the C49 phase to the C54 phase due to the thermal process. Contrastingly when the width of the polysilicon film is reduced, the change from the C49 phase to the C54 phase is hard to take place. Increases both in a rate of this high resistance phase C49 and in density of crystalline particle boundary induce an increment in resistivity of $TiSi_2$. Additionally, the thickness of the $TiSi_2$ film is relatively smaller in the peripheral portion to polysilicon than in the central portion. This is derived from the fact that a Ti-to-Si reaction is caused in the Ti film after Si has been diffused into the Ti film. An effect of reducing the thickness of the $TiSi_2$ film in the peripheral portion thereof becomes larger with a miniaturized configuration of the gate electrode as shown in FIG. 3D enough to induce a reduction in average thickness of the $TiSi_2$ to be formed. This also brings about the increment in terms of the resistance. From the above effects, the resistance abruptly increases in polysilicon having a width of 0.6 μm or under.

In this regard, according to the above-discussed embodiment of the second invention, the silicon layer and the metal layer are deposited and are made reactive on each other by the thermal process, and, after obtaining a stacked film composed of the silicon layer and the metal silicide film, a fine wiring effect can be avoided in miniaturized wiring with a gate length of 0.6 μm or under by effecting the patterning.

What has been stated above will be explained by exemplifying $TiSi_2$.

As illustrated in FIG. 4A, a Ti film is deposited 40 nm on the polysilicon by the sputtering method. After forming the $TiSi_2$ film by the RTA method, those undergoing the patterning to a variety of line widths by use of the RIE method are observed through the transmission electron microscope. FIGS. 4B, 4C and 4D are sketch diagrams showing a case where the line widths are 1.0 μm, 0.6 μm and 0.2 μm.

Figure 6:
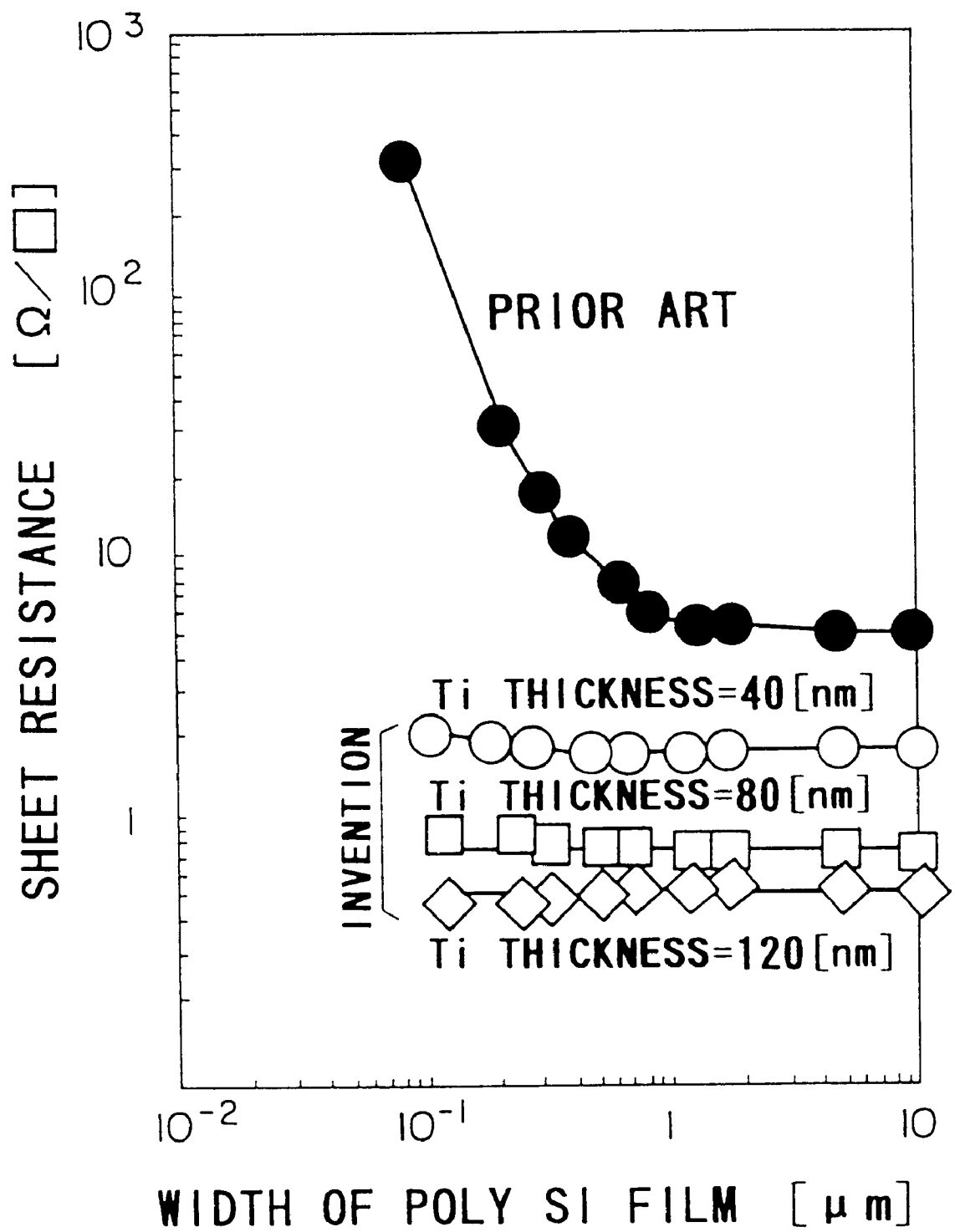
FIG. 6 is a characteristic diagram of assistance in explaining the effect of the embodiment shown in FIGS. 2A–2D.

Turning attention to FIGS. 4B, 4C and 4D, there are not seen the reduction in the crystalline particles with the decrease in the width of the polysilicon film or the increment in the crystalline particles as apparently seen in the prior art. But only C54 defined as a low resistance phase as in the case of the pattern having the large width is seen even when making it miniaturized. It is also confirmed that there is no decrease in the average thickness of the $TiSi_2$ film with the reduction of the pattern as seen in the prior art shown in FIG. 5, but the film is formed to have the same thickness even in the miniaturized pattern as in the same way with the wide pattern. From the above-mentioned, the thickness of the Ti film is changed such as 40 nm, 80 nm and 120 nm with respect to a pattern width dependency of a sheet resistance shown in FIG. 6, and the individual line widths are further changed in many ways. However, the fine wiring effect as seen in the prior art is not recognized, and it is possible to obtain the wiring that is low in terms of resistance but miniaturized.

Thus, according to the first embodiment of the second invention, the silicide film processed to a gate length of 0.6 μm or under generates no fine wiring effect, and an extremely preferable MOS transistor characteristic can be obtained. This stacked structure is also applicable to a gate electrode of an ordinary MOSFET having no conductor film 15 formed along the gate side wall in FIG. 2A–2D. This stacked structure is further applicable to other wiring for source/drain lead-out electrodes and an emitter electrode of a bipolar transistor, etc.

Note that the stacked film used as an interconnection for the gate electrode illustrated in FIG. 4A can be formed more specifically as follows. To start with, after forming a pattern of the nitride film on the titanium silicide layer, etching is effected by a gas containing a fluorine compound or a chlorine compound, a combination thereof, or with a high power under a low pressure, wherein this pattern serves as a mask. This etching is halted upon confirming that etching of the polysilicon layer starts after completely etching the titanium silicide layer. Thereafter, the polysilicon film is etched by a gas containing a bromine compound. Using the gas containing the bromine compound makes it possible to prevent the side surface of the titanium silicide layer from being etched and also prevent the substrate from being dug by etching after etching the oxide film under the polysilicon layer. A preferable processed configuration as shown in FIG. 4A can be actualized by the processing steps described above.

Further, the same effect as the above-mentioned can be obtained even when the polysilicon layer 13b is an amorphous silicon layer. The amorphous silicon layer can be also formed with attaining the amorphism by implanting the ions having a high dose into the polysilicon in addition to the method of forming the amorphous silicon layer by depositing amorphous silicon.

The method of forming the miniaturized interconnection composed of the stacked film including the low-resistance silicide film and the polysilicon in the embodiments discussed above is not confined to the gate electrode but may be used for the emitter electrode of the bipolar transistor. Further, the above method is broadly usable for devices required to avoid the fine wiring effect.

Figure 7:
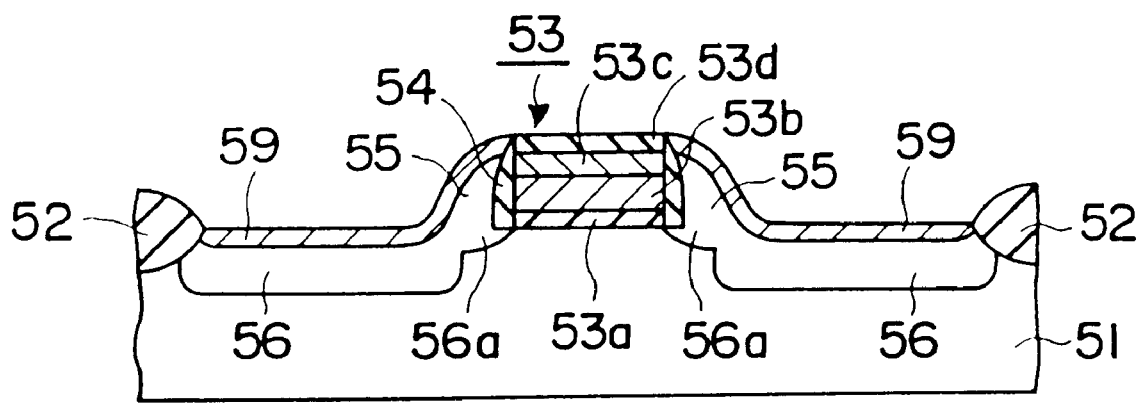
FIG. 7 is a sectional view illustrating a construction of a second embodiment of the semiconductor device according to the first invention.

Next, FIG. 7 illustrates a construction of a second embodiment of the semiconductor device according to the first invention. The semiconductor device in this embodiment is constructed such that a gate insulating film 53a is formed on the surface of a semiconductor substrate 51. A gate electrode 53 composed of a polysilicon film 53b, a $SiO_2$ film 53c and a SiN film 53d is formed on this gate insulating film 53a, and side walls 54 composed of $Si_3N_4$ are formed along the side areas of the gate electrode 53. Then, side wall conductor films 55 are formed adjacent to the side walls 54. Further, source/drain regions 56 are formed on the surface of the semiconductor substrate 51 on both sides of the conductor film 55 as well as along the side wall conductor films 55 so that the gate electrode 53 is sandwiched in therebetween. Metal silicide films 59 are formed on the surfaces of the source/drain regions 56. Note that source/drain regions 56a in the vicinity of the gate electrode 53 within the semiconductor substrate 51 are formed by diffusions from the side wall conductor films 55.

The source/drain regions 56a in the vicinity of the gate electrode in the semiconductor device in accordance with the second embodiment are also formed by the diffusions, and, therefore, the second embodiment exhibits the same effects as those in the first embodiment shown in FIG. 1.

Figure 8A:
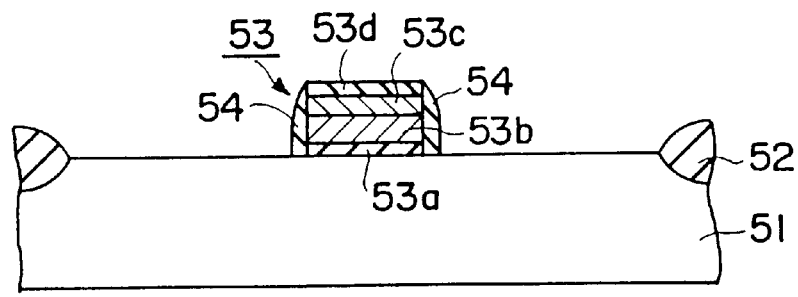
FIGS. 8A–8D are sectional views showing a manufacturing process in the second embodiment of the method of manufacturing the semiconductor device according to the second invention.

Next, a second embodiment of the method of manufacturing the semiconductor device according to the second invention will be discussed with reference to FIGS. 8A–8D. According to the manufacturing method in this embodiment, the semiconductor device illustrated in the second embodiment of the first invention which is shown in FIG. 7 is to be manufactured. To begin with, as illustrated in FIG. 8A, element isolation regions 52 are formed. Formed in sequence on the silicon substrate 51 are a gate oxide film 53a, a polysilicon film (doped with boron) 53b, a $SiO_2$ film 53c and a $Si_3N_4$ film 53d, and the patterning is carried out, thus forming the gate electrode 53. Subsequently, a $Si_3N_4$ film 54 is deposited 20 nm on the entire surface of the substrate, and thereafter etching is performed by use of the RIE method, thereby forming $Si_3N_4$ side walls 54.

Figure 8B:
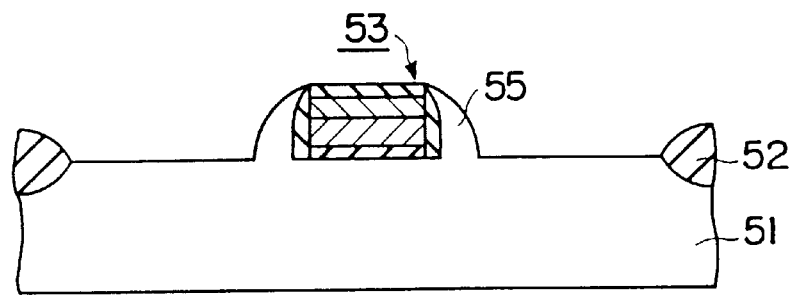

Next, as illustrated in FIG. 8B, after removing the natural oxide film on the substrate surface by the dilute fluorine acid treatment, the amorphous silicon film doped with the boron is deposited 150 nm on the entire surface of the substrate 51, and the etching is effected by use of the RIE method, thereby forming amorphous silicon side walls 55 with a width of 150 nm adjacently to the $Si_3N_4$ side wall 54 along the side surfaces of the gate electrode 53 on both sides. When forming the side walls 55, the polysilicon layer 53b of the gate electrode 53 is protected by the $SiO_2$ layer 53c, the $Si_3N_4$ layer 53d and the $Si_3N_4$ side walls 54 and undergoes no etching. Thereafter, the amorphous silicon side walls 55 are monocrystallized by heating in the nitrogen atmosphere at 600° C. for 30 minutes, thus forming monocrystalline side walls 55.

Figure 8C:
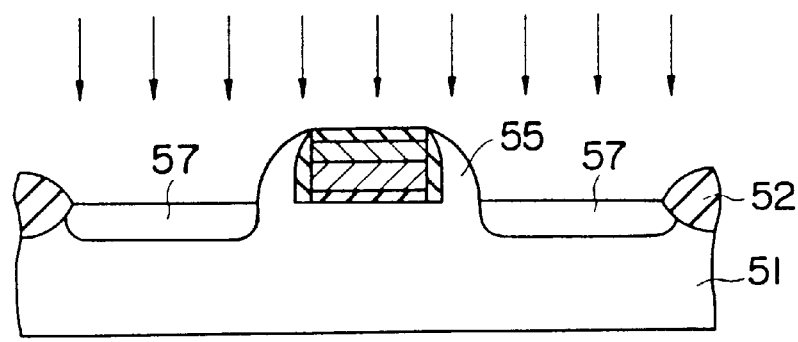
Figure 8D:
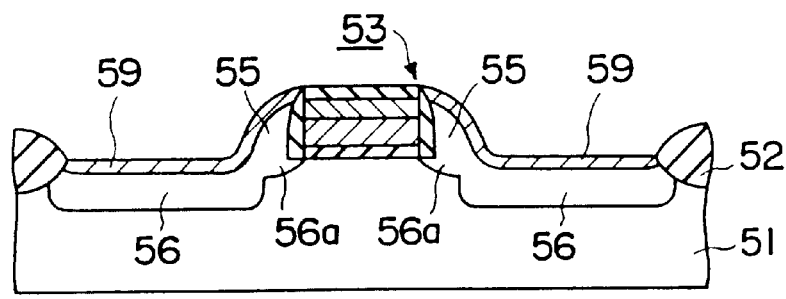

Next, as shown in FIG. BC, an impurity implanted layer 57 is formed by implanting $BF_2$ ions under such conditions that an acceleration voltage is 30 KeV, and a dose is on the order of $1\times10^{16}cm^{-3}$. Thereafter, as depicted in FIG. 8D, the impurity within the impurity implanted layer 57 is activated by the RTA method at 1000° C. for 10 sec, thereby forming source/drain diffused layers 56. On this occasion, the boron in the monocrystalline side walls 55 is diffused into the substrate 51, and diffused layer regions 56a that are high in concentration but small in junction depth are thereby formed. Subsequently, the Ti film is deposited 100 nm on the entire surface of the substrate by the sputtering method. This Ti film is then silicified, thereby forming $TiSi_2$ films 59 on the monocrystalline side walls as well as on the source/drain layers 56. Thereafter, the interconnections are formed by using the same method with the prior art, thus completing the MOSFET.

Figure 9A:
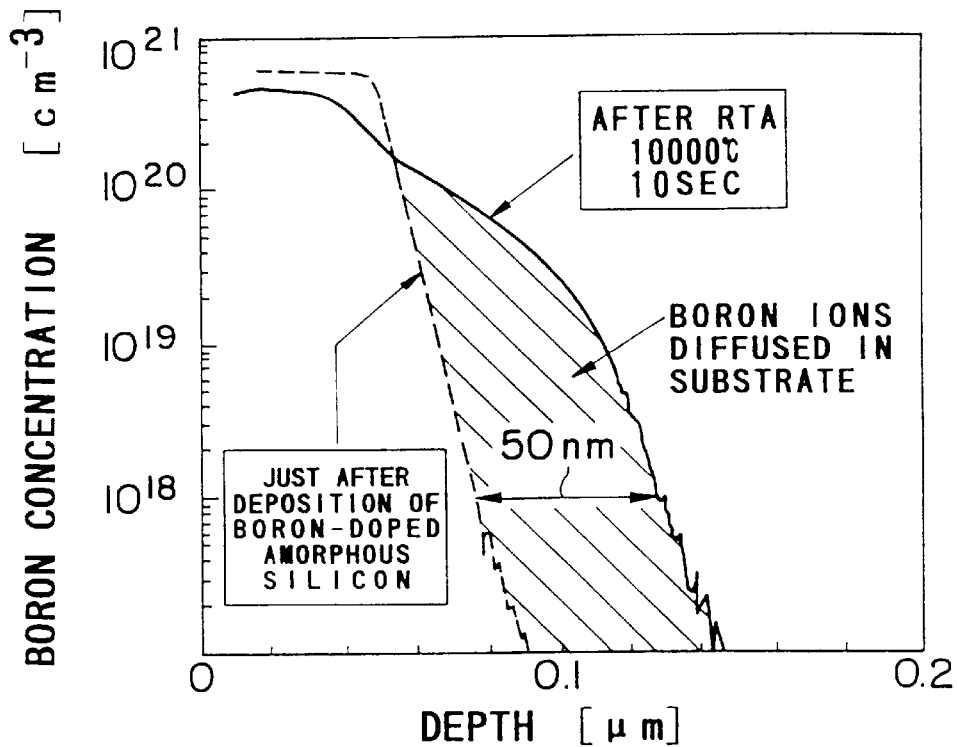
FIGS. 9A and 9B are graphic charts of assistance in explaining an effect of the embodiment but shows a result of measuring an impurity distribution in a depthwise direction.
Figure 9B:
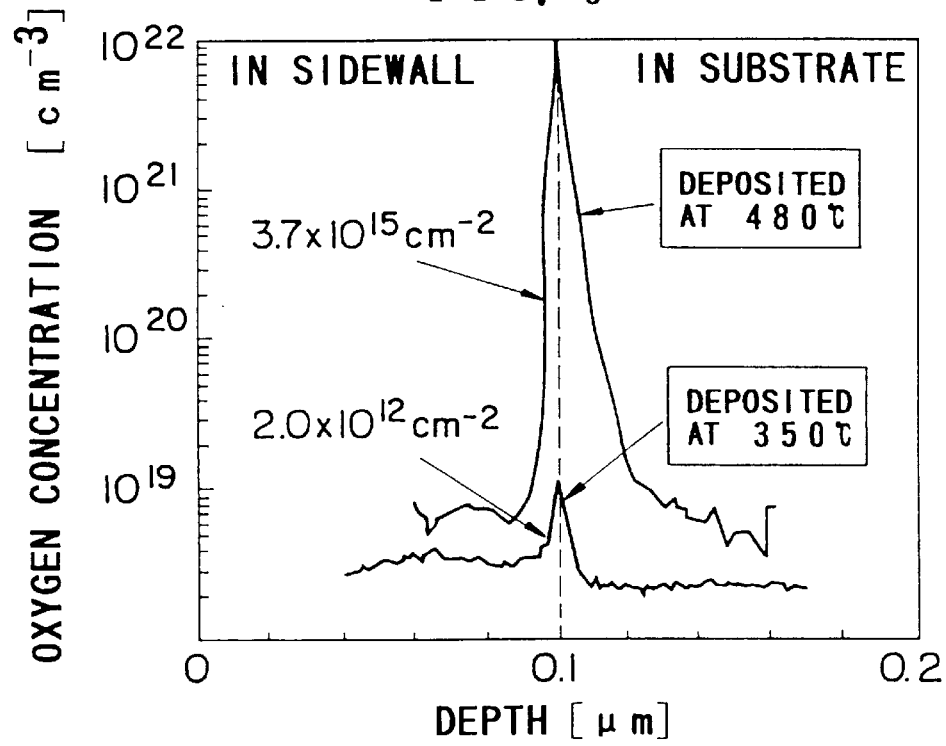

FIGS. 9A shows a result of a SIMS (Secondary-Ion Mass Spectroscopy) analysis of a distribution of the boron concentration in the depthwise direction from the surface of the side wall 55 before and after forming the diffused layers 56a formed by the diffusions in the MOSFET formed by the processes shown in FIGS. 8A–8D. FIG. 9B shows a result of SIMS-analyzing a distribution of an oxygen concentration in the depthwise direction from the surface of the side wall 55 when forming the side walls 55 by depositing the amorphous silicon doped with the boron at 350° C. and 480° C. As known from FIG. 9A, the boron concentration before forming the diffused layers 56a is substantially uniform in the side wall 55 (0–0.25 µm in depth) but, after forming the diffused layers 56a, exhibits the maximum value ($4\times10^{20}$ $cm^{-3}$) in the side wall 55. However, the boron concentration is abruptly reduced in a larger depth than the position where the maximum value is exhibited. Then, the surface concentration of the diffused layer 56a at this time is as high as $2\times10^{20}cm^{-3}$, whereas the junction depth is small on the order of 50 nm.

In contrast with this, the impurity concentration of the conventional LDD-structured low-concentration diffused region is on the order of $1.5\times10^{19}cm^{-3}$, and the junction depth is 55 nm (ion implantation conditions: $4\times10^{13}cm^{-2}$ in dose, and 15 KeV). The impurity concentration of the diffused regions in the vicinity of the SPDD-structured gate is on the order of $2.0\times10^{19}cm^{-3}$, and the junction depth is 34 nm (RTA conditions: 1000° C., 15 sec) Hence, the diffused regions in the vicinity of the gate electrode of the semiconductor device manufactured by the manufacturing method in this embodiment exhibit a higher concentration than in the SPDD structure but has a shallower junction than in the LDD structure.

Further, as known from FIG. 9B, average concentrations of oxygen of an interface when deposited at 350° C. and 480° C. are $2.0\times10^{12}cm^{-2}$ and $3.7\times10^{12}cm^{-2}$, respectively. Hereby, there exists almost no oxide film at the interface between the side wall 55 and the substrate 51 when deposited at 350° C. Therefore, the deposition at approximately 350° C. is more preferable in terms of decreasing the resistance.

Figure 10:
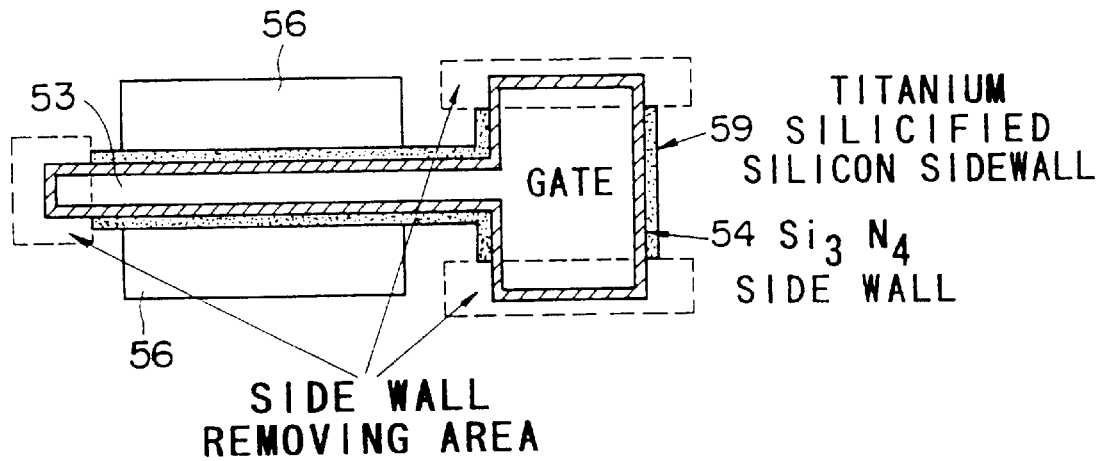
FIG. 10 is a plan view illustrating the semiconductor device in the embodiment shown in FIG. 7.

Note that a broken-line area of the side wall 54 completely surrounding the gate electrode 53 is, as illustrated in FIG. 10, etching-removed by the RIE method in order to electrically separate the source/drain regions 56.

Figure 11:
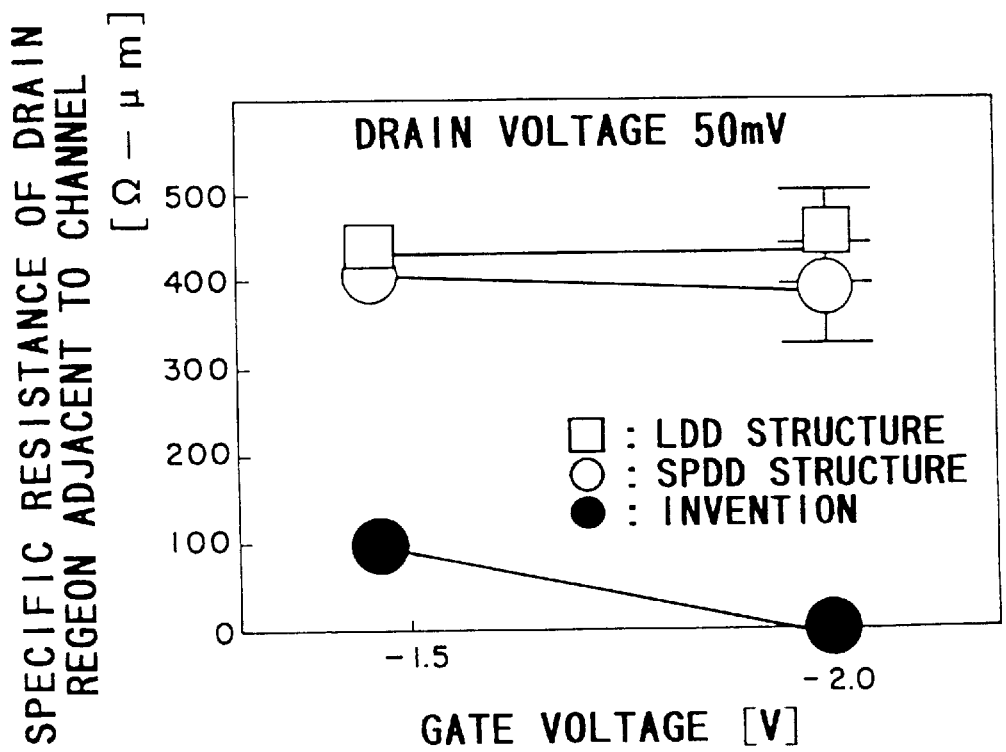
FIG. 11 is a characteristic diagram of assistance in explaining the effect of the embodiment shown in FIG. 7.
Figure 21:
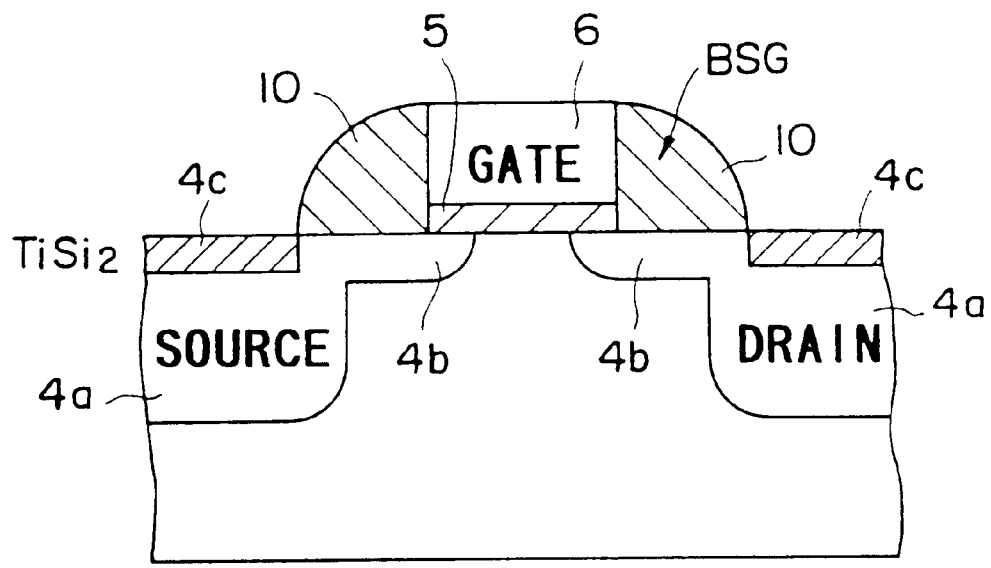
FIG. 21 is a sectional view showing a MOSFET based on a conventional SPDD structure.

Next, electric characteristics of the semiconductor device in the second embodiment of the first invention which is shown in FIG. 7 will be explained with reference to FIGS. 11–16. FIG. 11 shows a gate voltage dependent characteristic of resistance of only a shallow diffused layer around the channel of the MOSFET of each of this embodiment (see FIG. 7), the conventional LDD structure (see FIG. 20) and the SPDD structure (see FIG. 21). This characteristic is the one when a drain voltage is 50 mV, and the resistance of only the shallow diffused layer around the channel is extracted by a method of Chang et al. As known from the characteristics shown in FIG. 11, a specific resistance of the MOSFET in this embodiment is 100 Ωµm or smaller as compared with approximately 400 Ωµm attained as the minimum value with other structure.

Incidentally, it is preferable in terms of the characteristic that the specific resistance of the shallow diffused layer of the MOSFET is 300 Ωµm or under according to the knowledge of the present inventors. In the case of manufacturing the semiconductor device in this embodiment, however, that is attainable by controlling the impurity concentration added when implanting the ions or when depositing the amorphous silicon film.

Figure 12:
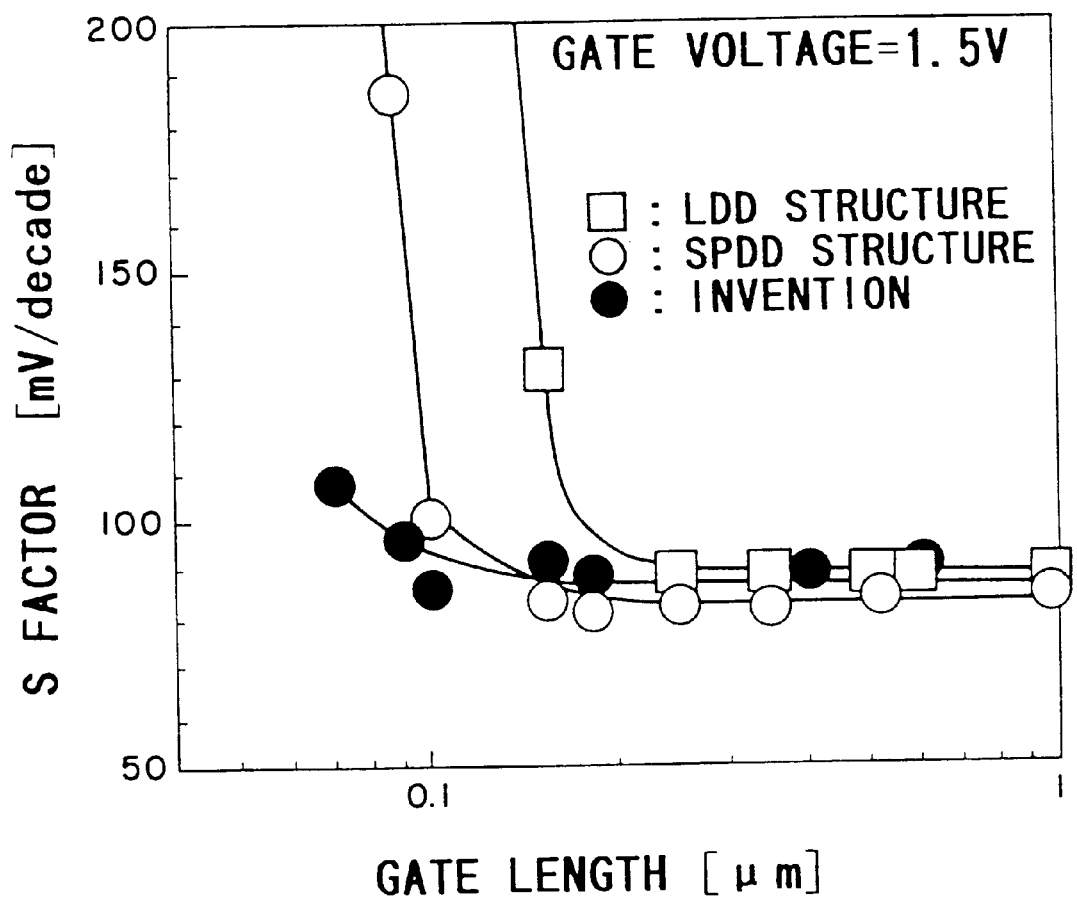
FIG. 12 is a characteristic diagram showing a gate length dependency of an S factor in the semiconductor device of the embodiment shown in FIG. 7.

Further, FIG. 12 shows a gate length Lg dependent characteristic of an S factor of the MOSFET of each of this embodiment, the conventional LDD structure and the SPDD structure. As known from this characteristic, when a gate length Lg is 0.1 µm or under, the S factor of the MOSFET in this embodiment is smaller than others, and the short channel effects are restrained. This is attributed to the fact that the junction depth of the diffused layer around the channel of the MOSFET in this embodiment is smaller than others or that an effective channel length is large.

Figure 13:
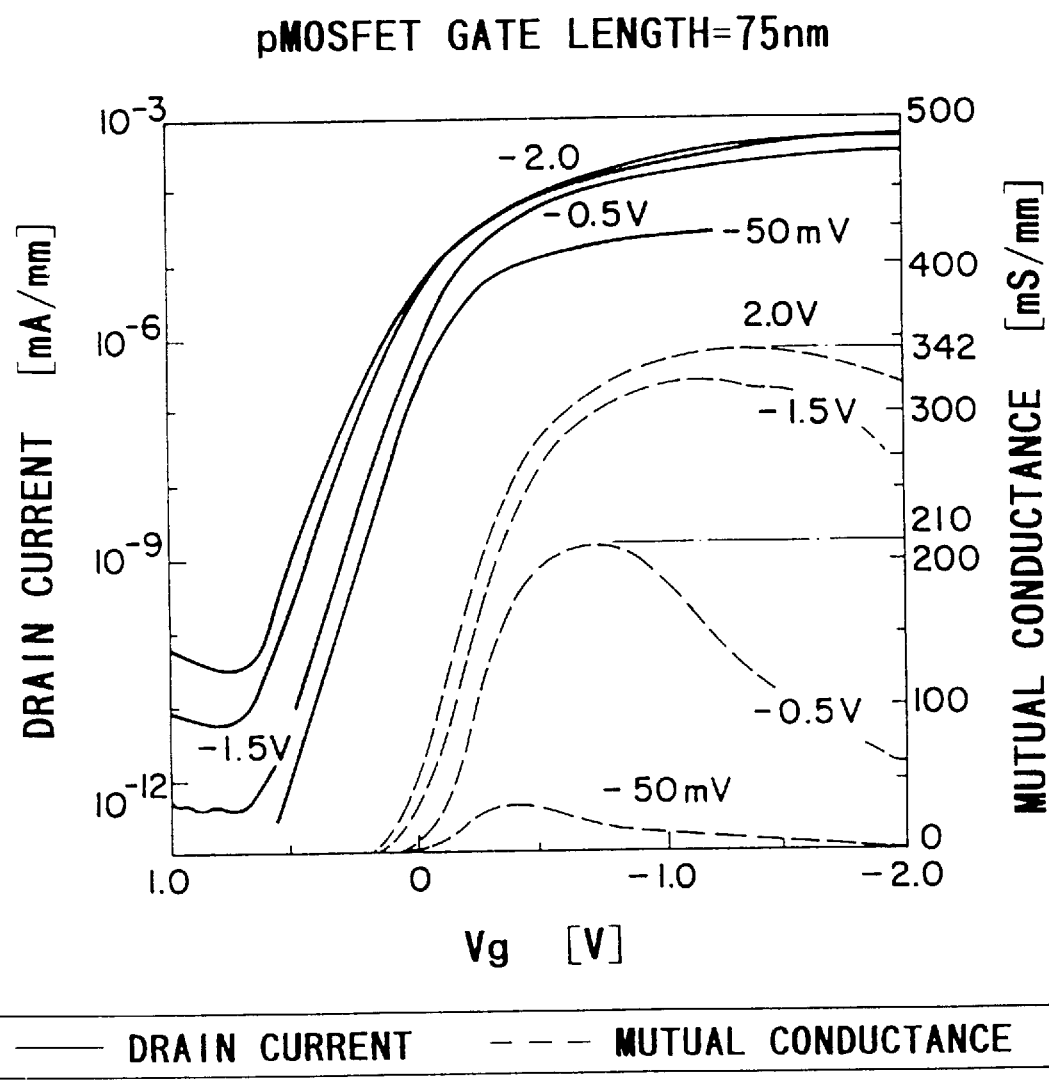
FIG. 13 is a characteristic diagram showing a gate voltage dependency of a drain current and a mutual conductance in the semiconductor device of the embodiment shown in FIG. 7.

Further, FIG. 13 shows a gate voltage Vg dependent characteristic of a mutual conductance and a drain current of the MOSFET based on the construction of this embodiment. This characteristic is the one when a gate length Lg is 75 nm, and a drain voltage Vd is −2.0 V, −1.5 V, −0.5 V and −50 mV. It can be known that the maximum value of the mutual conductance when the drain voltage Vd is −2.0 V is as large as 342 mS/mm enough to exhibit a well subthreshold characteristic. Note that the maximum value of the mutual conductance when operated at −0.5 V is 210 mS/mm.

Figure 14A:
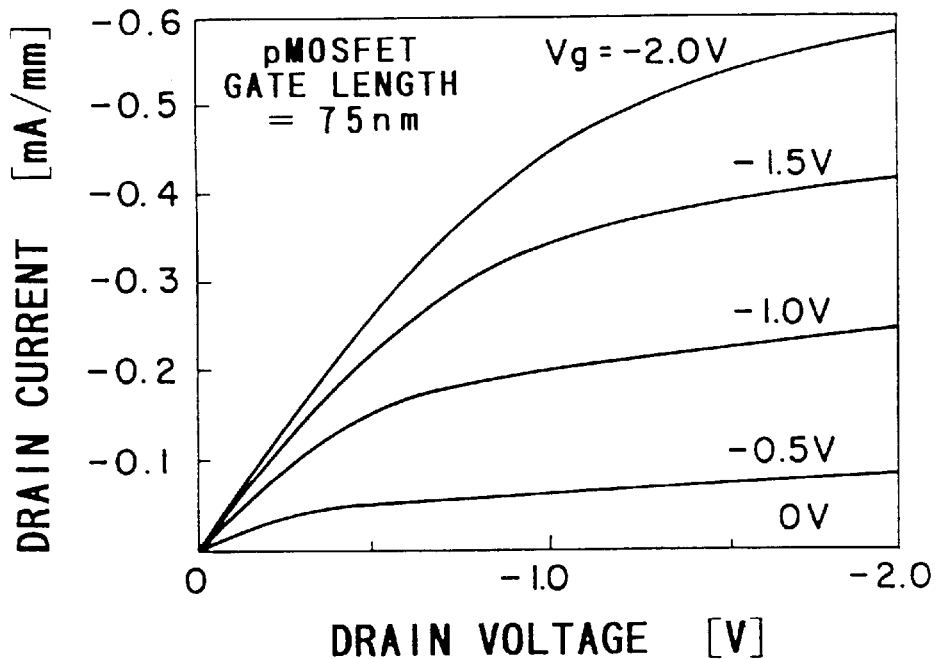
FIGS. 14A and 14B are characteristic diagrams showing a drain voltage dependency of the drain current in the semiconductor device of the embodiment shown in FIG. 7.
Figure 14B:
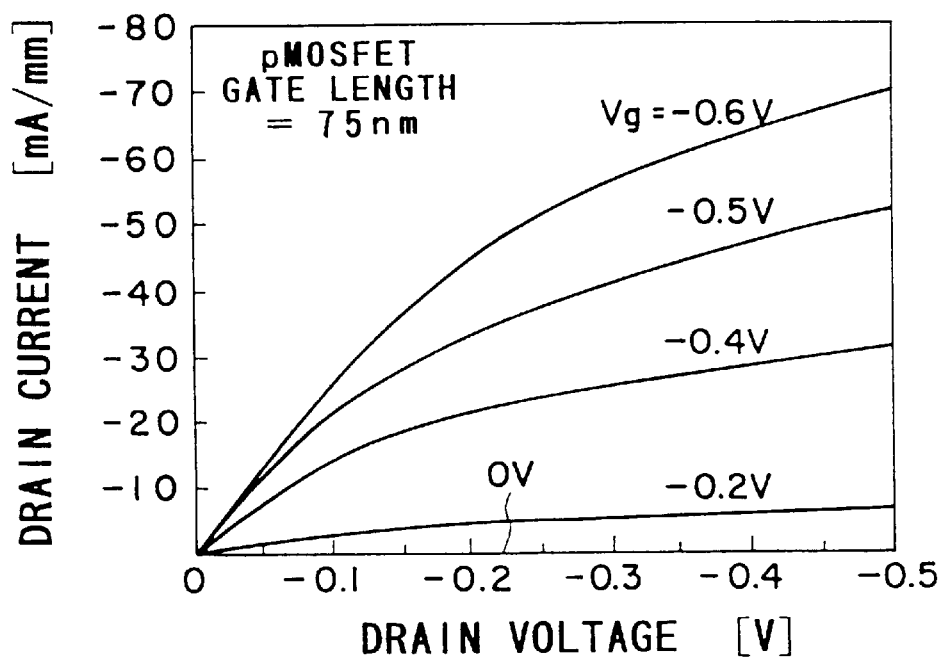

Further, FIGS. 14A and 14B show a drain voltage dependent characteristic of the drain current of the MOSFET based on the structure of this embodiment, wherein the gate length is 75 nm. A drain current on the order of 0.58 mA/$\mu$m is obtained when Vg=Vd=−2.0 V. A drain current as large as 53 $\mu$A/$\mu$m is obtained also in the low-voltage operation when Vg=Vd=0.5 V.

Figure 15:
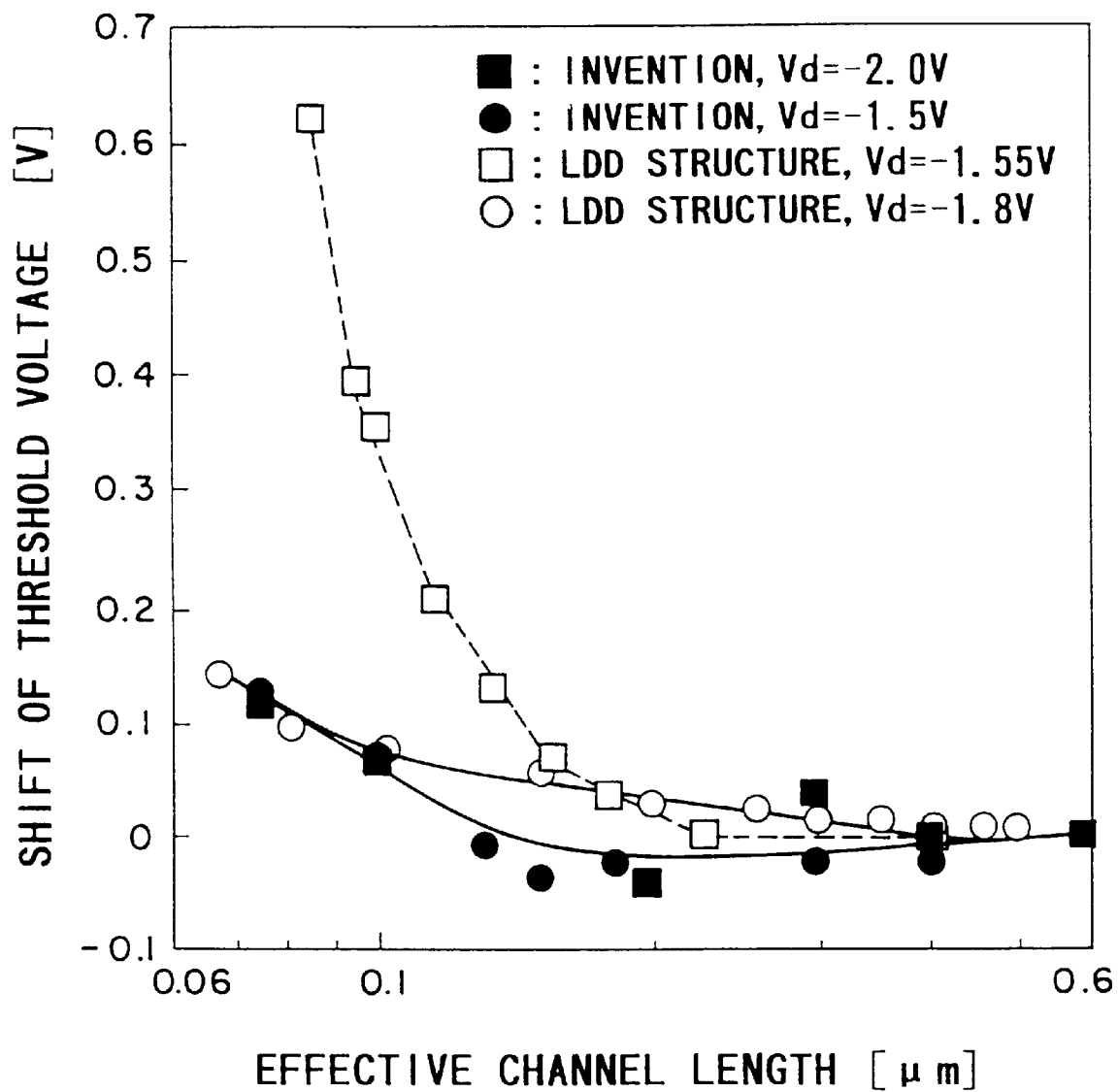
FIG. 15 is a characteristic diagram showing an effective channel dependency of a threshold voltage in the semiconductor device of the embodiment shown in FIG. 7.
Figure 16:
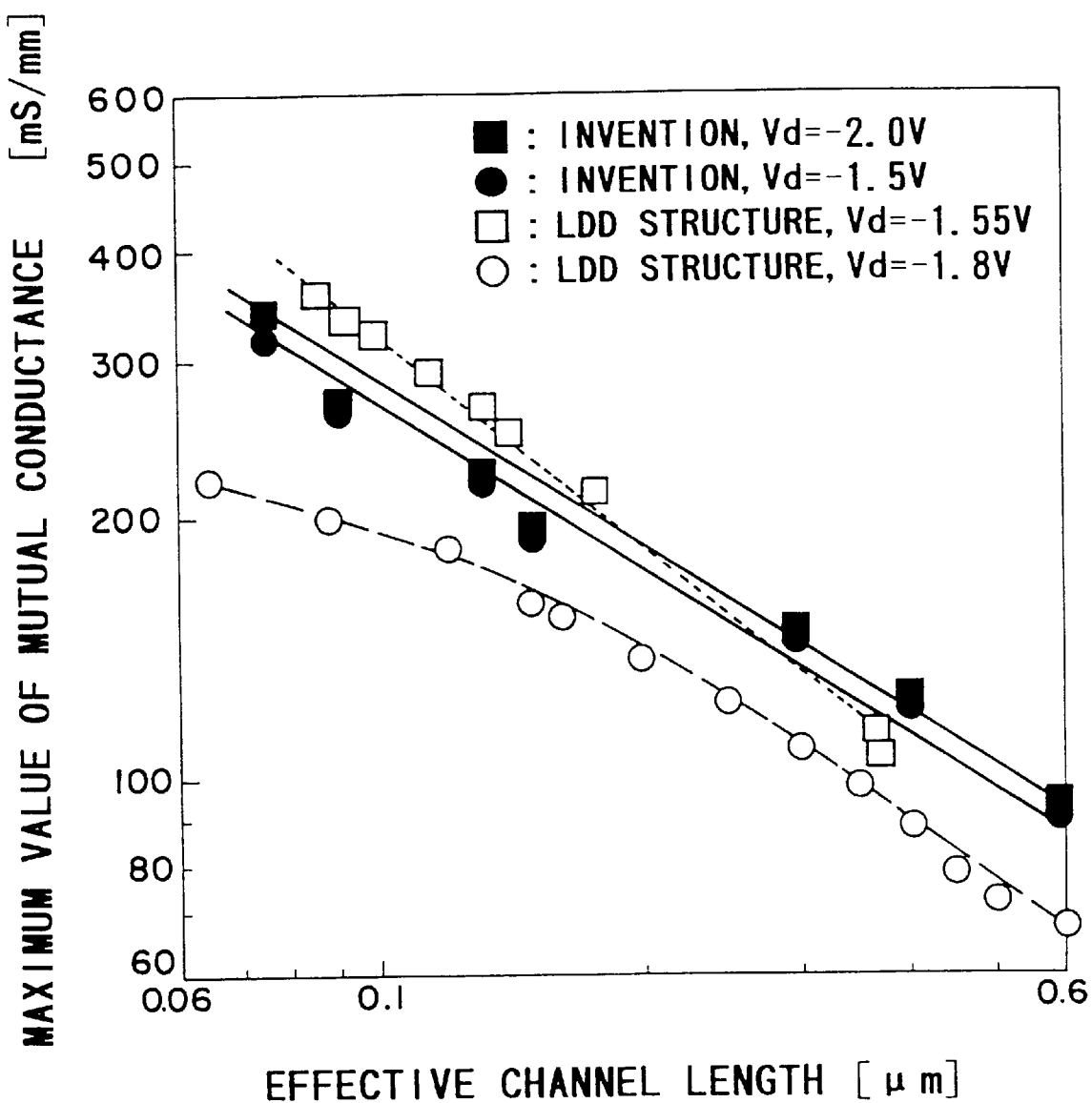
FIG. 16 is a characteristic diagram showing an effective channel dependency of the maximum value of the mutual conductance in the semiconductor device of the embodiment shown in FIG. 7.

Further, FIGS. 15 and 16 show dependent characteristics with respect to an effective channel length of a shift of the threshold voltage and a maximum value of the mutual conductance of the MOSFET based on the structure of this embodiment and the conventional LDD structure. It can be known that the characteristic of the MOSFET in this embodiment is more preferable than in the LDD structure when the effective channel length is 0.1 $\mu$m or under.

As discussed above, according to the semiconductor device in the second embodiment of the first invention, the diffused layer 56a in the vicinity of the gate electrode can be formed as shallow as 50 nm in the junction depth with a high concentration, and hence a high current drivability can be obtained while restraining the short channel effect. Note that the high current drivability can be obtained as much as possible while restraining the short channel effect on such conditions that the surface concentration of the diffused layer 56a is on the order of $3\times10^{19}\text{cm}^{-3}$, and the junction depth is up to approximately 100 nm according to the knowledge of the present inventors.

Incidentally, in the manufacturing process shown in FIG. 8, the side wall 55 composed of the amorphous silicon doped with the boron is monocrystallized and then subjected to the ion implantation, and the source/drain regions 56, 56a are formed by the diffusions. However, before monocrystallizing the side wall 55, the impurity region is formed by implanting the ions into the entire surface of the substrate, and, thereafter, the thermal treatment is carried out for monocrystallization at 600° C. for 30 minutes. Subsequently, the boron is diffused into the side walls as well as diffusing the impurity in the above impurity region by the RTA method, and the source/drain regions 56, 56a may be thus formed. In this case, the side walls 55 are monocrystallized after implanting the ions thereinto, and hence it is possible to restrain such a phenomenon that a distribution of ion species when implanted becomes deeper along a direction of the silicon crystal.

The low-resistance impurity concentration regions 56a that are still shallower than in the case of the manufacturing process shown in FIG. 8 are thereby formed, and the short channel effect can be restrained.

Next, a third embodiment of the method of manufacturing the semiconductor device according to the second invention will be described with reference to FIGS. 17A–17D. According to this manufacturing method, the MOSFET in the second embodiment of the first invention that is shown in FIG. 7 is to be manufactured.

The gate insulating film 53a, the gate electrode 53 and the side walls 54 composed of $Si_3N_4$ are formed on the silicon substrate 51 in the same way so far with the manufacturing process shown in FIG. 8. Thereafter, the $BF_2$ ions are implanted into the entire surface of the substrate under such conditions that the acceleration voltage is 15 KeV, and the dose is on the order of $1\times10^{13}\text{cm}^{-2}$, thus forming the source/drain impurity regions 56 (see FIG. 17A).

Figure 17A:
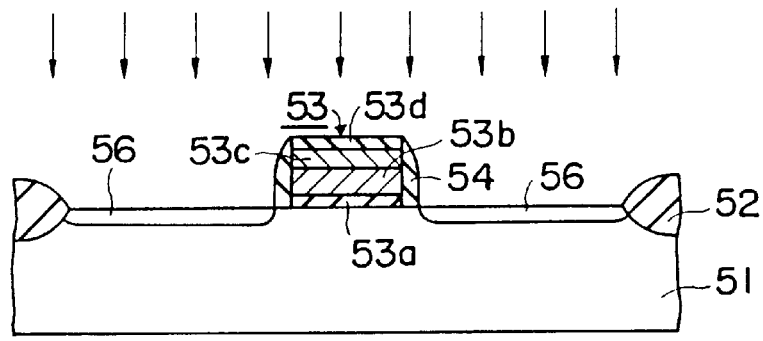
FIGS. 17A–17D are sectional views illustrating a manufacturing process in a third embodiment of the method of manufacturing the semiconductor device according to the second invention.
Figure 17B:
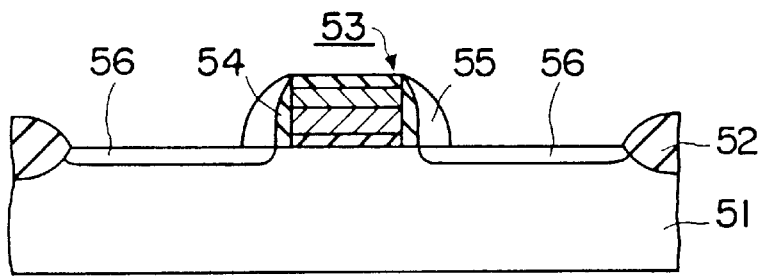

Next, as illustrated in FIG. 17B, the amorphous silicon film doped with the boron is formed 150 nm in thickness on the whole surface of the substrate, and then the etching is performed by the RIE method, whereby the amorphous silicon side walls 55 are formed 150 nm in width adjacently to the $Si_3N_4$ side walls 54 along the side surfaces of the gate electrode 53 on both sides. On this occasion, the polysilicon layer 53b doped with the boron is protected by the $SiO_2$ layer 53c, $Si_3N_4$ layer 53d and undergoes no etching. Subsequently, the amorphous silicon side walls 55 are monocrystallized by heating at 600° C. for 30 minutes in the nitrogen atmosphere, thus forming the monocrystalline silicon side walls 55.

Figure 17C:
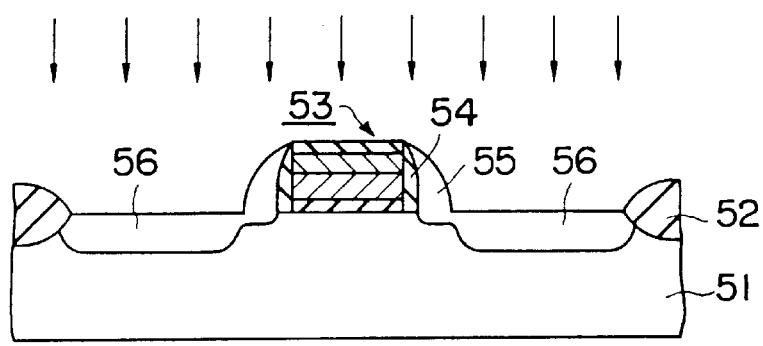
Figure 17D:
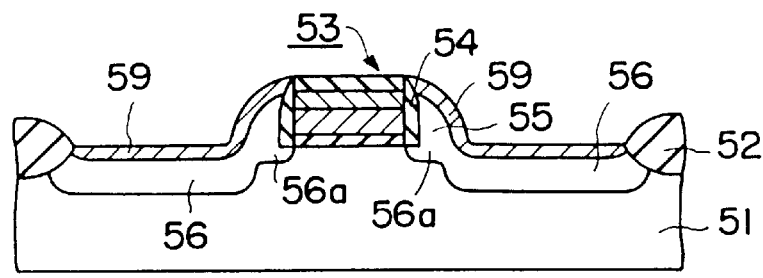

Next, as illustrated in FIG. 17C, the ions are implanted under such conditions that the acceleration voltage is 30 KeV, and the dose is on the order of $1\times10^{16}\text{cm}^{-2}$. Thereafter, as depicted in FIG. 17D, the impurity is, activated by the RTA method at 1000° C. for 10 sec, thereby forming the source/drain diffused layers 56. On this occasion, the boron in the side walls 55 is diffused into the substrate, and the diffused layers 56a that are high in concentration but small in junction depth are thereby formed. Subsequently, the Ti film is deposited 100 nm on the entire surface of the substrate by the sputtering method. This Ti film is then silicified, thereby forming $TiSi_2$ films 59 on the monocrystallized side walls as well as on the source/drain layers 56. Thereafter, the wires are formed in the same way with the prior art, thus completing the MOSFET.

According to the manufacturing methods in the second and third embodiments, when requiring an enhancement of the current drivability, the control may be performed to decrease the width of the monocrystalline silicon side wall 55, i.e., the thickness of the amorphous silicon film, but increase the width of the monocrystalline silicon side wall 55 when requiring the restraint of the short channel effect.

Moreover, according to the manufacturing methods in the second and third embodiments, the conductor side wall 55 is formed by monocrystallizing the amorphous silicon film. However, the side wall may be monocrystallized by using the polysilicon film or the like instead of the amorphous silicon film. It is, however, possible to obtain a betterformed crystal by using the amorphous silicon when monocrystallized.

Still further, according to the manufacturing methods in the second and third embodiments, the conductor side wall 55 involves the use of the monocrystalline silicon film. Instead, however, a metal film, e.g., a WSi, film may also be used. A manufacturing method in the case of employing the metal film as the conductor side wall 55 is substantially the same as the manufacturing process shown in FIGS. 8A–8D. Referring to FIG. 8B, however, the SWi film is deposited instead of depositing the amorphous silicon film 55 doped with boron, and the conductor side wall composed of WSi may be formed by etching based on the RIE method. Thereafter, the same processes as those shown in FIGS. 8C and 8D are conducted. Note that the metal silicide film 59 illustrated in FIG. 8 is not formed. In this case also, when activating the source/drain diffused layer 56 by use of the RTA method, boron is diffused into the substrate from the conductor side wall 55, whereby the diffused layer 56a that is high in concentration but small in junction depth can be obtained. The diffused beron in this example, is that accumulated into the conductor side walls 55 through the ion implantation for forming the source/drain regions.

Thus, by using the metal film for the conductor side wall 55, the resistance of the side wall 55, i.e., the source/drain region, is reduced down to a smaller value, and the current drivability can be further enhanced.

Note that the manufacturing methods in the second and third embodiments have dealt with how the p-channel MOSFET is manufactured. An n-channel MOSFET can be similarly, manufactured by reversing the conductivity of the impurity.

Next, a third embodiment of the semiconductor device according to the first invention will be discussed with reference to FIGS. 18A–18C. The semiconductor device in this embodiment is constructed such that the gate electrode takes a stacked structure comprising a polysilicon layer, a layer composed of a refractory metal or a refractory metal silicide, and a polysilicon layer. FIG. 18C illustrates this stacked structure. Processes of manufacturing the semiconductor device in this embodiment will be explained.

Figure 18A:
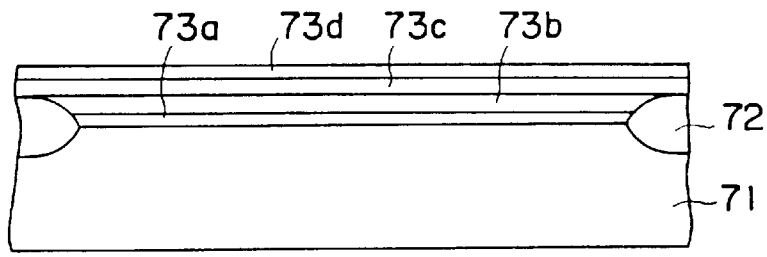
FIGS. 18A–18C are sectional views illustrating the manufacturing process in the third embodiment of the semiconductor device according to the first invention.

First, as illustrated in FIG. 18A, a gate insulating film 73a is formed on a silicon substrate 71 formed with element isolation regions 72, and subsequently a polysilicon film 73b is formed 300 nm in thickness. Thereafter, for example, a Ti film is deposited 100 nm in thickness on the entire surface thereof. Then, a $TiSi_2$ film 73c is formed on the polysilicon film 73b by performing a thermal treatment at 750° C. for 30 minutes by the RTA method. Subsequently, a polysilicon film 73d is formed 200 nm in thickness on the entire surface thereof.

Figure 18B:
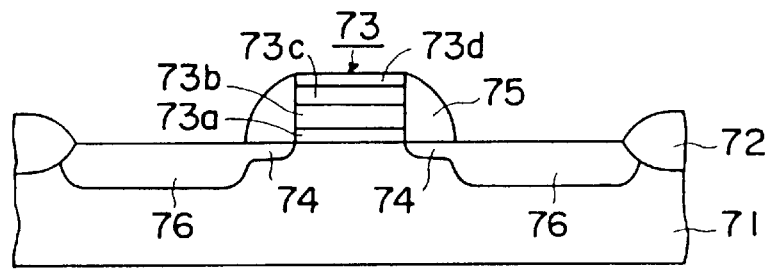
Figure 18C:
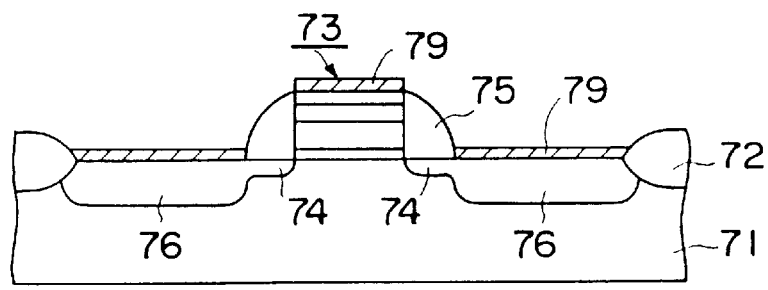

Next, as depicted in FIG. 18B, a gate electrode 73 is formed with an execution of patterning by use of the RIE method, and subsequently As ions are implanted on such conditions that the acceleration voltage is 20 KeV, and the dose is on the order of $1 \times 10^{14} cm^{-2}$, thus forming an N-type diffused layer 74. Thereafter, an SiN film is deposited 200 nm in thickness on the whole surface of the substrate, and hereafter $Si_3N_4$ side walls 75 are formed along the side walls of the gate electrode 73 by performing the anisotropic etching based on the RIE method. Subsequently, the As ions are implanted under such conditions that the acceleration voltage is 40 KeV, and the dose is on the order of $3 \times 10^{15} cm^{-2}$, with the gate electrodes 73 ad the SiN side wall 75 serving as masks. Thereafter, the ion-implanted impurity is activated by effecting the thermal treatment based on the RTA method, thereby forming source/drain diffused layers 76, 74.

Next, as shown in FIG. 18C, a Ti film is formed 20 nm in thickness on the entire surface of the substrate by use of the sputtering method. Then, the Ti film, the substrate 71 and silicon in the polysilicon layer 73d of the gate electrode react on each other by performing the thermal treatment using the RTA method, thus forming a $TiSi_2$ film 19. Thereafter, a $TiSi_2$ film 79 is selectively made residual on only the source/drain diffused layer 76 and on the polysilicon layer 73d of the gate electrode 73 by effecting a sulfate hydrogen peroxide water series treatment.

In the embodiment discussed above, the metal silicide film 73c is formed before the patterning of the gate electrode 73, and, therefore, it is possible to avoid the fine wiring effect, decrease the gate resistance and enhance the current drivability. Further, the short channel effect can be restrained because of the LDD structure.

In addition, the refractory silicide film 79 is formed on the uppermost surface of the gate electrode 73, and the gate resistance can be therefore reduced, whereas the current drivability can be increased.

Note that other refractory metal films may be employed in place of the $TiSi_2$ film 73c in the semiconductor device in the embodiment described above.

Next, a fourth embodiment of the method of manufacturing the semiconductor device according to the second invention will be discussed with reference to FIGS. 19A–19D.

Figure 19A:
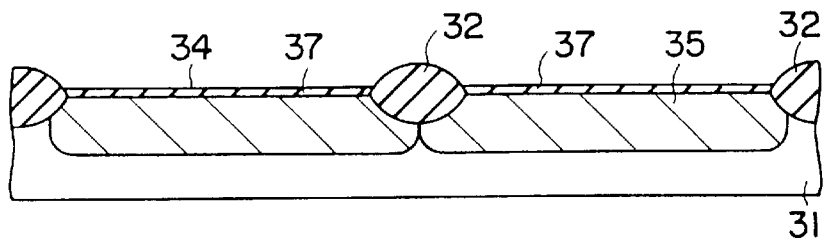
FIGS. 19A–19D are sectional views illustrating a manufacturing process in a fourth embodiment of the method of manufacturing the semiconductor device according to the second invention.

First, as illustrated in FIG. 19A, a field oxide film 32 is formed on the surface of an n-type silicon substrate 31 by a LOCOS method or the like. Thereafter, an oxide film 37 is formed, and the ions are implanted through this oxide film 37, thus forming a P-well region 34 and an N-well region 35.

Figure 19B:
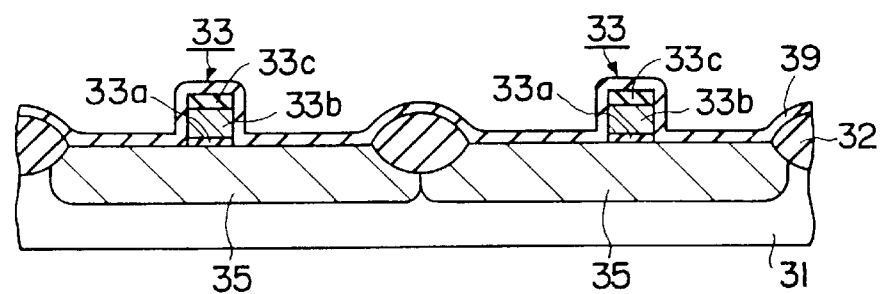

Next, after removing the oxide film 37, as depicted in FIG. 19B, after forming a gate portion composed of a gate oxide film 33a, a tungsten film 33b and a nitride film 33c, a carbon film 39 is formed 40 nm in thickness on the surface thereof by the sputtering method.

Figure 19C:
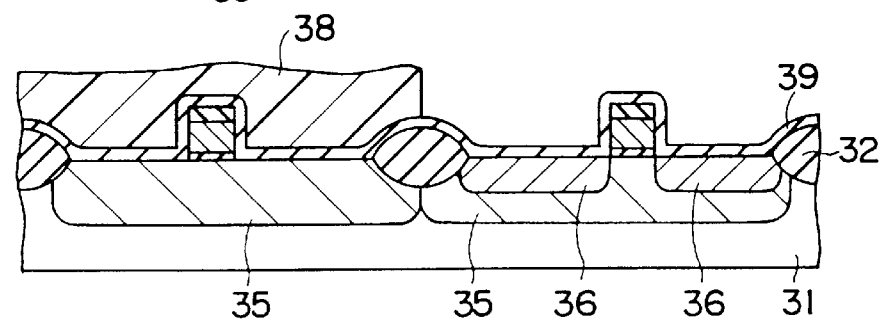
Figure 19D:
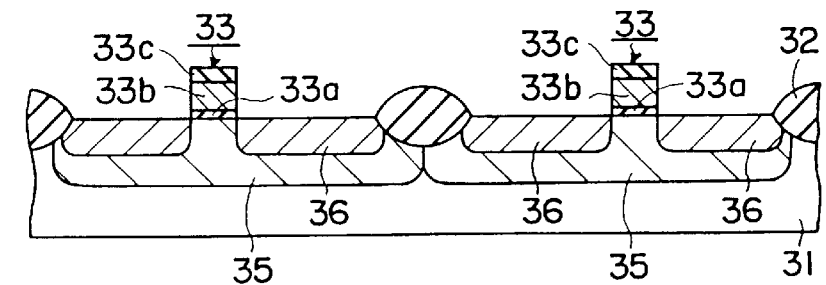

Ensuing thereto, as illustrated in FIG. 19C, after forming a resist mask 38 on the carbon film 39 in an NMOS region, the $BF_2$ ions are implanted into the substrate through the carbon film 39 under such conditions that the acceleration voltage is 30 KeV, and the dose is on the order of $4 \times 10^{15} cm^{-2}$. Thereafter, the resist 38 is removed by the sulfate hydrogen peroxide series water treatment. On this occasion, however, the tungsten film 33b is covered with the carbon film 39 and the nitride layer 33c and therefore undergoes no etching with the sulfate hydrogen peroxide series water treatment. Similarly, after forming the resist mask on the carbon film 39 in a PMOS region, the As ions are implanted under such conditions that the acceleration voltage is 30 KeV, and the dose is on the order of $4 \times 10^{15} cm^{-2}$. The impurity introduced by the ion implantation assumes a shallow profile because of the ions being implanted through the carbon film 39, and the short channel effect can be restrained. Hereafter, as illustrated in FIG. 19D, ashing is performed in an oxygen plasma, thereby completely removing the carbon film 39. This treatment does not damage the tungsten film 33b.

Thereafter, the source/drain diffused layer 36 is formed by effecting TRA at 1000° C. for 20 sec.

In accordance with this embodiment, in advance of forming the resist 38 for the ion implantation, the surface of the substrate 31 is covered with the carbon film 39, and this is removed after implanting the ions. Hence, the tungsten film 33b can be prevented from being dissolved by a sulfate hydrogen peroxide series solution with the carbon film 39 serving as a mask.

Generally, it can be considered that the implantation energy is restrained low for obtaining a shallow diffused layer of the MOSFET. Decreasing the implantation energy, however, causes problems in which a monitoring reliability declines, and an intra-substrate-surface scatter in terms of the dose is produced. Under such circumstances, as in this embodiment, it is feasible to form the shallow-junction diffused layer without decreasing the implantation energy and also restrain the short channel effect.

Further, tungsten is employed as a material of the gate electrode 33, and hence it is possible to decrease the resistance but enhance the current drivability.

Incidentally, in accordance with this embodiment, though tungsten is used as a material of the metal electrode for the gate, the embodiment discussed above can be carried out, and the same effect can be obtained, even in such a case that a metal exhibiting a low resistance value is employed as other metal electrode material.

As discussed above, according to the present invention, the short channel effect can be restrained, and, at the same time, the current drivability that is as high as possible can be obtained.

It is apparent that, in this invention, a wide range of different working modes can be formed based on the invention without deviating from the spirit and scope of the invention. This invention is not restricted by its specific working modes except being limited by the appended claims.

What is claimed is:

1. A semiconductor device comprising:

a semiconductor substrate;

a gate insulating film formed on the surface of said substrate;

a gate electrode formed on said gate insulating film;

a side wall insulating film formed along a side wall of said gate insulating film as well as on said gate electrode;

a side wall conductor film formed adjacent to said side wall insulating film; and a source/drain region formed in said side wall conductor films on both sides of said gate electrode, in a surface region of said substrate under said side wall conductor film and in a surface region, adjacent to said side wall conductor film, of said substrate, wherein an impurity concentration of an interface region between said side wall conductor film and said substrate is $3 \times 10^{19}$ cm$^{-3}$ or higher, and a junction depth of said source/drain region in said substrate in the vicinity of said gate insulating film is 10 nm or under.

2. A semiconductor device according to claim 1, wherein said source/drain region is formed extending to an edge portion of said gate insulating film on the substrate surface.

3. A semiconductor device according to claim 1, wherein an impurity concentration of said source/drain region formed on said side wall conductor film and on said substrate under said side wall conductor film is equal to or higher than an impurity concentration of said source/drain region formed on the surface region, adjacent to said side wall conductor film, of said substrate.

4. A semiconductor device according to claim 3, wherein said side wall conductor film is a monocrystalline semiconductor film.

5. A semiconductor device according to claim 3, wherein said side wall conductor film is a polycrystalline semiconductor film.

6. A semiconductor device according to claim 3, wherein said side wall conductor film is a metal film.

7. A semiconductor device according to claim 1, wherein a metal silicide film is formed on the surface of said source/drain region.

8. A semiconductor device according to claim 1, wherein said gate electrode has a stacked structure composed of a silicon layer and a metal silicide layer formed on the surface region of said silicon layer or a metal layer formed on said silicon layer.

9. A semiconductor device according to claim 8, further comprising a semiconductor layer formed on said metal silicide layer or on said metal layer.

10. A semiconductor device comprising:

a semiconductor substrate;

a gate insulating film formed on the surface of said substrate;

a gate electrode formed on said gate insulating film;

a side wall insulating film formed along a side wall of said gate insulating film as well as on said gate electrode;

a side wall conductor film formed adjacent to said side wall insulating film; and a source/drain region formed in said side wall conductor film on both sides of said gate electrode, in a surface region of said substrate under said side wall conductor film and in a surface region, adjacent to said side wall conductor film, of said substrate, wherein a specific resistance of said source/drain region formed on said side wall conductor film and on the surface region of said substrate under said side wall conductor film is 300 Ω·μm or under.

11. A semiconductor device according to claim 10, wherein said source/drain region is formed extending to an edge portion of said gate insulating film on the substrate surface.

12. A semiconductor device according to claim 10, wherein an impurity concentration of said source/drain region formed on said side wall conductor film and on said substrate under said side wall conductor film is equal to or higher than an impurity concentration of said source/drain region formed on the surface region, adjacent to said side wall conductor film, of said substrate.

13. A semiconductor device according to claim 12, wherein said side wall conductor film is a monocrystalline semiconductor film.

14. A semiconductor device according to claim 12, wherein said side wall conductor film is a polycrystalline semiconductor film.

15. A semiconductor device according to claim 12, wherein said side wall conductor film is a metal film.

16. A semiconductor device according to claim 10, wherein a metal silicide film is formed on the surface of said source/drain region.

17. A semiconductor device according to claim 10, wherein said gate electrode has a stacked structure composed of a silicon layer and a metal silicide layer formed on the surface region of said silicon layer or a metal layer formed on said silicon layer.

18. A semiconductor device according to claim 17, further comprising a semiconductor layer formed on said metal silicide layer or on said metal layer.

* * * * *